(12) United States Patent
Nakamura et al.

(10) Patent No.: US 11,189,608 B2
(45) Date of Patent: Nov. 30, 2021

(54) SEMICONDUCTOR DEVICE

(71) Applicant: FUJI ELECTRIC CO., LTD., Kanagawa (JP)

(72) Inventors: Hideyo Nakamura, Matsumoto (JP); Motohito Hori, Matsumoto (JP); Yuki Inaba, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/801,048

(22) Filed: Feb. 25, 2020

(65) Prior Publication Data
US 2020/0194415 A1    Jun. 18, 2020

Related U.S. Application Data

(63) Continuation of application No. PCT/JP2019/002152, filed on Jan. 23, 2019.

(30) Foreign Application Priority Data

Mar. 7, 2018    (JP) .............................. JP2018-041116

(51) Int. Cl.
*H01L 25/18*    (2006.01)
*H01L 23/053*    (2006.01)
(Continued)

(52) U.S. Cl.
CPC ............ *H01L 25/18* (2013.01); *H01L 23/053* (2013.01); *H01L 23/49* (2013.01); *H01L 23/498* (2013.01); *H01L 25/072* (2013.01)

(58) Field of Classification Search
CPC ... H01L 23/053; H01L 23/3735; H01L 23/48; H01L 23/49; H01L 23/498; H01L 23/5385; H01L 24/01; H01L 25/072; H01L 25/18

See application file for complete search history.

(56) References Cited

U.S. PATENT DOCUMENTS 4,788,626 A * 11/1988 Neidig ................. H01L 25/072
361/715
2010/0007026 A1* 1/2010 Shikano ................. H01L 24/49
257/773
(Continued)

FOREIGN PATENT DOCUMENTS

JP     2014082484 A    5/2014
WO    2013145619 A1  10/2013
(Continued)

OTHER PUBLICATIONS

International Search Report and (ISA/237) Written Opinion of the International Search Authority for International Patent Application No. PCT/JP2019/002152, mailed by the Japan Patent Office dated Apr. 2, 2019.

*Primary Examiner* — Allan R Wilson

(57) ABSTRACT

A semiconductor device includes circuit substrates 3 and 9 including circuit pattern layers 3c/9b, a semiconductor element 5 mounted to the circuit pattern layer 3c, a connecting pin 7 connecting the semiconductor element 5 to the circuit pattern layer 9b, a pin-shaped terminal 17 connected to the circuit pattern layer 9b, a sealing member 2 sealing the circuit substrates 3 and 9, the semiconductor element 5, and the connecting pin 7, and an external terminal 27 including a flat plate portion 27s and an extending portion 27t bent from the flat plate portion 27s and extends away from the circuit substrate 9, in which the flat plate portion 27s is connected to the pin-shaped terminal 17 and arranged in parallel with the circuit pattern layer 9b, and the extending portion 27t is provided in a range of a width in a transverse direction of the sealing member 2.

12 Claims, 14 Drawing Sheets

(51) Int. Cl.
*H01L 23/49* (2006.01)
*H01L 23/498* (2006.01)
*H01L 25/07* (2006.01)

(56) References Cited

U.S. PATENT DOCUMENTS

| | | |
|---|---|---|
| 2014/0103519 A1 | 4/2014 | Steger |
| 2014/0246783 A1* | 9/2014 | Nishizawa .......... H01L 23/4334 |
| | | 257/774 |
| 2014/0346659 A1 | 11/2014 | Nakamura |
| 2014/0361424 A1 | 12/2014 | Horio |
| 2014/0367736 A1 | 12/2014 | Iizuka |
| 2015/0223339 A1 | 8/2015 | Nakamura |
| 2016/0365307 A1* | 12/2016 | Miyakoshi .............. H01L 24/32 |

FOREIGN PATENT DOCUMENTS

| | | |
|---|---|---|
| WO | 2013145620 A1 | 10/2013 |
| WO | 2013146212 A1 | 10/2013 |
| WO | 2014061211 A1 | 4/2014 |

\* cited by examiner

SEMICONDUCTOR DEVICE

The contents of the following Japanese patent application are incorporated herein by reference:
2018-041116 filed in JP on Mar. 7, 2018
PCT/JP2019/002152 filed on Jan. 23, 2019

BACKGROUND

1. Technical Field

The present invention relates to a semiconductor device.

2. Related Art

A power semiconductor device (simply referred to as a semiconductor device) is constituted, for example, as follows. That is, a semiconductor element such as an insulated gate bipolar transistor (IGBT) or a metal oxide silicon field effect transistor (MOSFET) is mounted on a main surface of a circuit substrate made of ceramics in which a conductive foil such as copper (Cu) or aluminum (Al) is provided on both surfaces. A printed circuit board is overlapped on the semiconductor element. A surface electrode of the semiconductor element and a circuit pattern formed on the conductive foil on the main surface are electrically connected to each other by a plurality of pin-shaped terminals inserted into this printed circuit board. An external terminal is erected on the circuit pattern. The circuit substrate is sealed in a rigid casing by molding using thermosetting resin such as epoxy resin. A leading end of the external terminal protrudes to interlink the electrode from the casing, and the other surface of the circuit substrate is exposed from the casing (for example, see PTL 1). In the above-mentioned semiconductor device, since the semiconductor element and the circuit pattern on the circuit substrate are electrically connected to each other by the printed circuit board and the pin-shaped terminals inserted into this printed circuit board instead of bonding wires, the semiconductor device is downsized, and a wiring path is shortened along with this downsizing. Thus, a wiring inductance is reduced, and a high speed operation can be consequently performed. In addition, since respective components are sealed in the rigid casing, reliability of a power cycle or the like is increased.

For example, to increase a capacity of the semiconductor device, PTLs 2 to 4 disclose a structure in which a single semiconductor device having a large output is connected in parallel with a plurality of semiconductor devices having a small output using a busbar, and a cap including an external terminal which is screwable is put on to cover the entirety of the plurality of these semiconductor devices.
PTL 1: International Publication No. 2014/061211
PTL 2: International Publication No. 2013/145619
PTL 3: International Publication No. 2013/146212
PTL 4: International Publication No. 2013/145620

However, as in PTLs 2 to 4, in a case where a current flows through the busbar arranged in a direction crossing among a plurality of semiconductor modules provided side by side, and a current of conductors in the modules flows in a longitudinal direction of the semiconductor modules, an issue occurs that a current direction of the busbar intersects with a current direction of the conductors in the modules, and a mutual inductance of these is not decreased.

In addition, since the pin-shaped terminal that protrudes from an upper surface of the semiconductor module and is connected to the external terminal has a smaller cross-sectional area as compared with the external terminal, the inventors of the present invention has found that the inductance tends to be large when a wiring length of this part is long.

SUMMARY (Item 1) According to an aspect of the present invention, there is provided a semiconductor device. The semiconductor device may include a first circuit substrate including a first circuit pattern layer. The semiconductor device may include a semiconductor element mounted to the first circuit pattern layer. The semiconductor device may include a second circuit substrate including a second circuit pattern layer. The semiconductor device may include a connecting pin that connects the semiconductor element to the second circuit pattern layer. The semiconductor device may include a pin-shaped terminal electrically connected to the second circuit pattern layer. The semiconductor device may include a sealing member that seals the first circuit substrate, the semiconductor element, the second circuit substrate, and the connecting pin using resin. The semiconductor device may include an external terminal including a flat plate portion and an extending portion that is bent from the flat plate portion and extends in a direction away from the second circuit substrate. The flat plate portion may be connected to the pin-shaped terminal and arranged in parallel with the second circuit pattern layer. The extending portion may be provided in a range of a width of the sealing member in a transverse direction.

In accordance with the above-described configuration, since a current direction of the second circuit pattern layer and a current direction of the flat plate portion of the external terminal can be set to be in parallel with each other, a mutual inductance in this part can be decreased.

In addition, since the pin-shaped terminal connected to the external terminal can be further shortened, an impedance generated at the pin-shaped terminal can be further decreased. Since the pin-shaped terminal is short, a thickness of the sealing member can be further decreased. Thus, since the use amount of resin can be reduced, material costs can be reduced, and bending stress caused by a difference between a thermal expansion coefficient of a resin member and a thermal expansion coefficient of the circuit substrate can be reduced. (Item 2) A sign of a rate of change of current of a current flowing through the flat plate portion may be a sign inverse to a sign of a rate of change of current of a current flowing through the second circuit pattern layer. (Item 3) Currents may be caused to flow in the flat plate portion and the second circuit pattern layer in the same direction in parallel. (Item 4) The semiconductor device may include another external terminal including another extending portion electrically connected to the first circuit pattern layer and arranged in parallel with the extending portion. (Item 5) A plurality of the pin-shaped terminals may be respectively connected to areas in the vicinity of opposite lateral sides of the flat plate portion in the transverse direction of the sealing member. (Item 6) The semiconductor device may include a cap including a plurality of through holes that allow insertion of the extending portions. (Item 7) The cap may include a nut accommodation portion that accommodates a nut. The external terminal may include a through hole at an end of the extending portion opposite to the flat plate portion. The extending portion may be bent in such a manner that the through hole is arranged above the nut. (Item 8) The semiconductor device may include a plurality of external terminals including flat plate portions and extending portions that are bent from the flat plate portions and extends in the direction away from the second circuit substrate. The semiconductor device may include a cap including a plurality of through holes that allow insertion of the extending portions. The semiconductor device may include insulating walls that extend from the cap or the sealing member and provided on outer circumferences of the flat plate portions. The flat plate portions may be arranged in spaces surrounded by the cap, the sealing member, and the insulating walls. (Item 9) The insulating walls may include a sealing member-side insulating wall that extends from the sealing member. The insulating walls may include a cap-side insulating wall that extends from the cap. A side surface of the sealing member-side insulating wall may be in direct contact with a side surface of the cap-side insulating wall. (Item 10) A length of the flat plate portion of the external terminal may be longer than a length of the other flat plate portion of the other external terminal in a longitudinal direction of the sealing member. (Item 11) The semiconductor device may include another first circuit substrate arranged to be adjacent to the first circuit substrate and connected to the other external terminal. The flat plate portion of the external terminal may extend up to an area above the other first circuit substrate.

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention will be described by way of embodiments, but the following embodiments are not intended to limit the invention described in the scope of the invention. In addition, not all combinations of features described in the embodiments necessarily have to be essential to solving means of the invention.

Figure 1A:
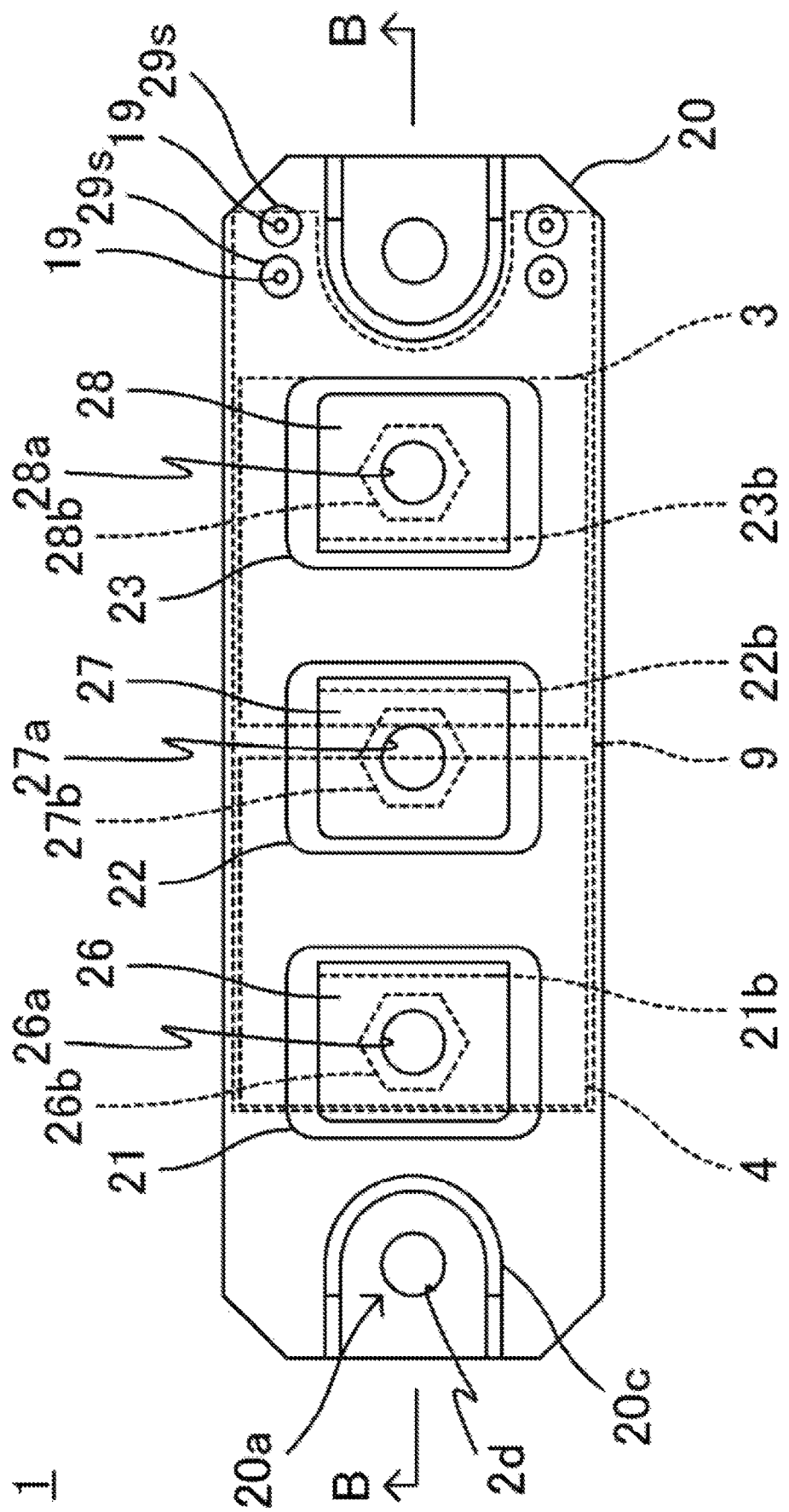
FIG. 1A is a drawing illustrating a configuration of a semiconductor device in a top view according to the present embodiment.
Figure 1B:
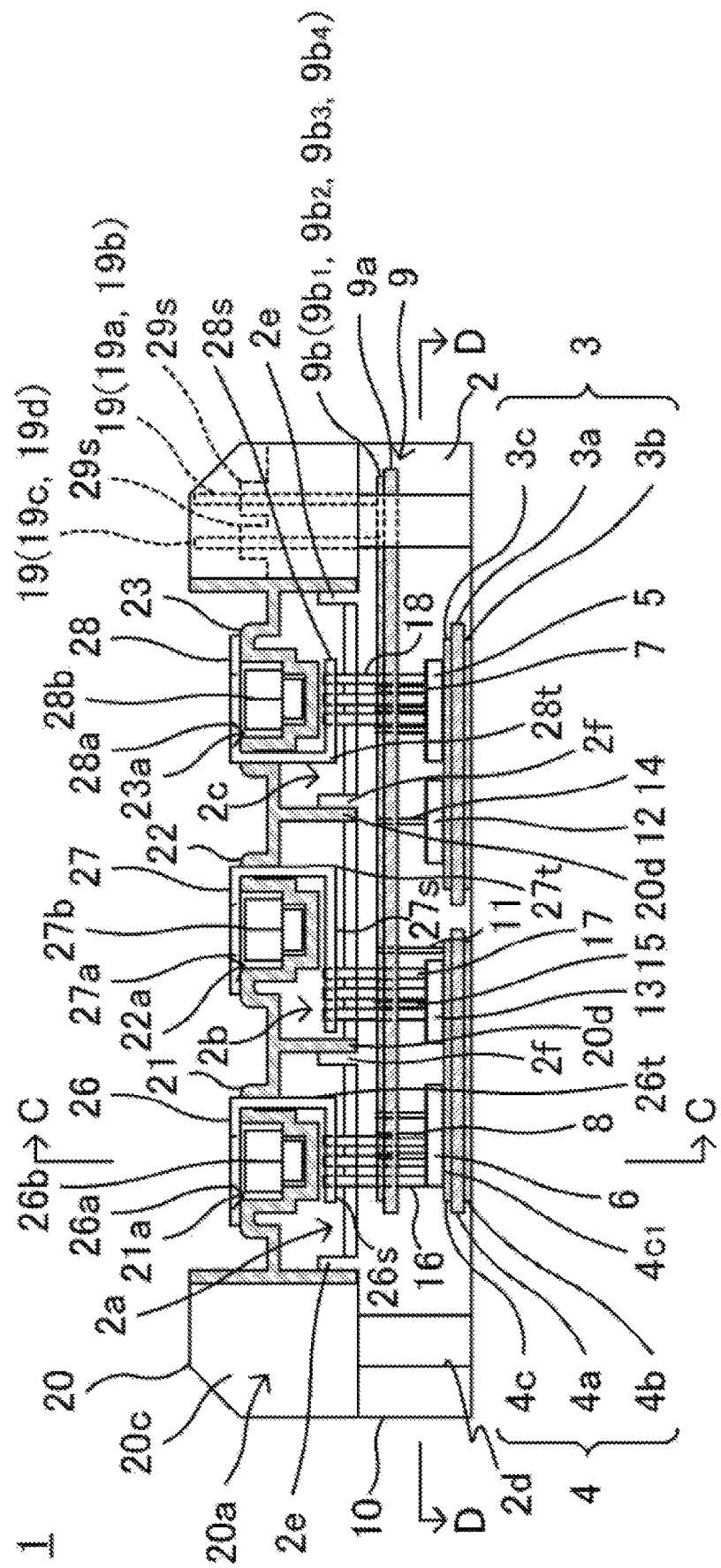
FIG. 1B is a drawing illustrating a cross-sectional configuration of the semiconductor device in a lateral view with regard to a reference line BB in FIG. 1A.
Figure 1C:
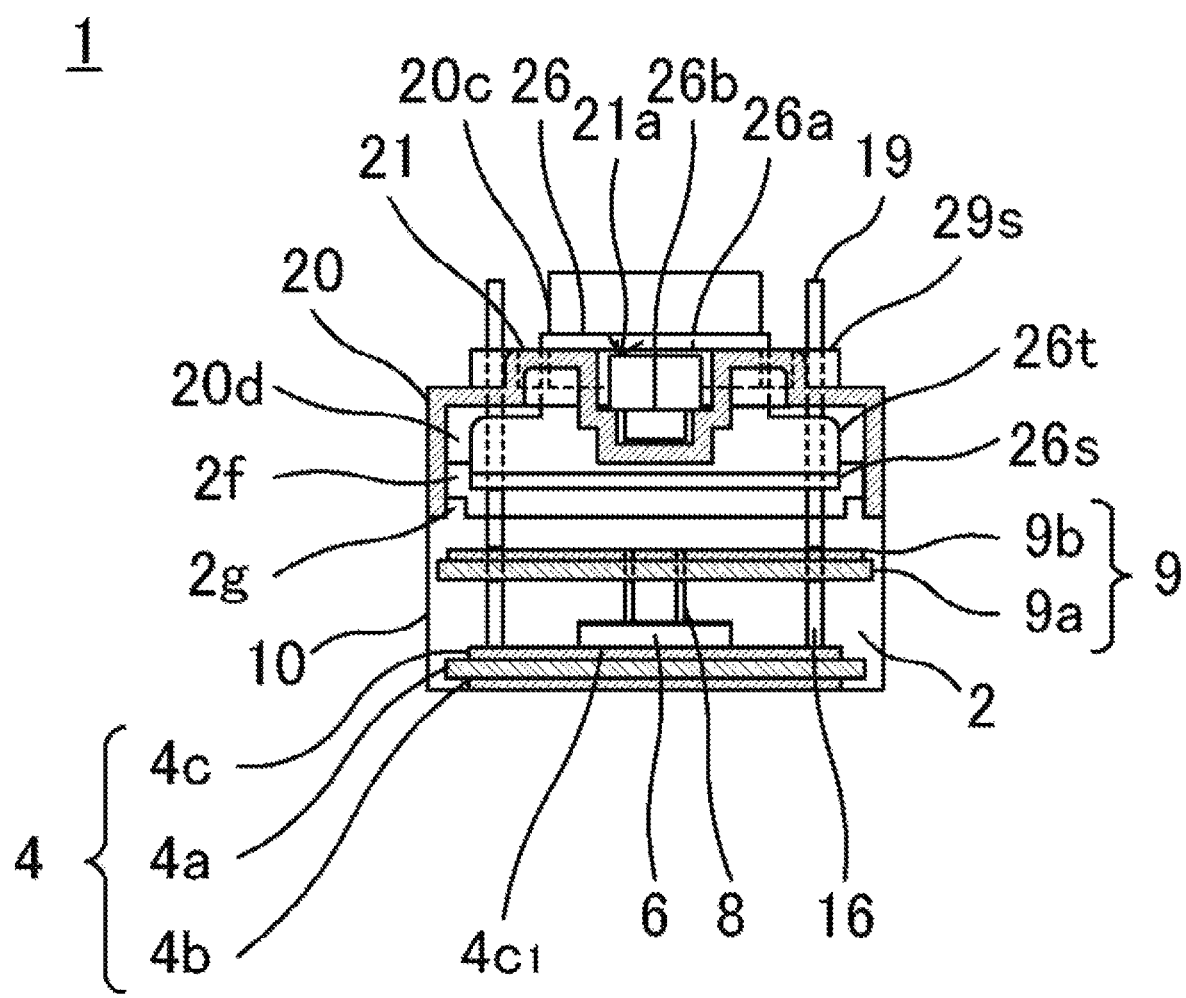
FIG. 1C is a drawing illustrating a cross-sectional configuration of the semiconductor device in the top view with regard to a reference line CC in FIG. 1B.
Figure 1D:
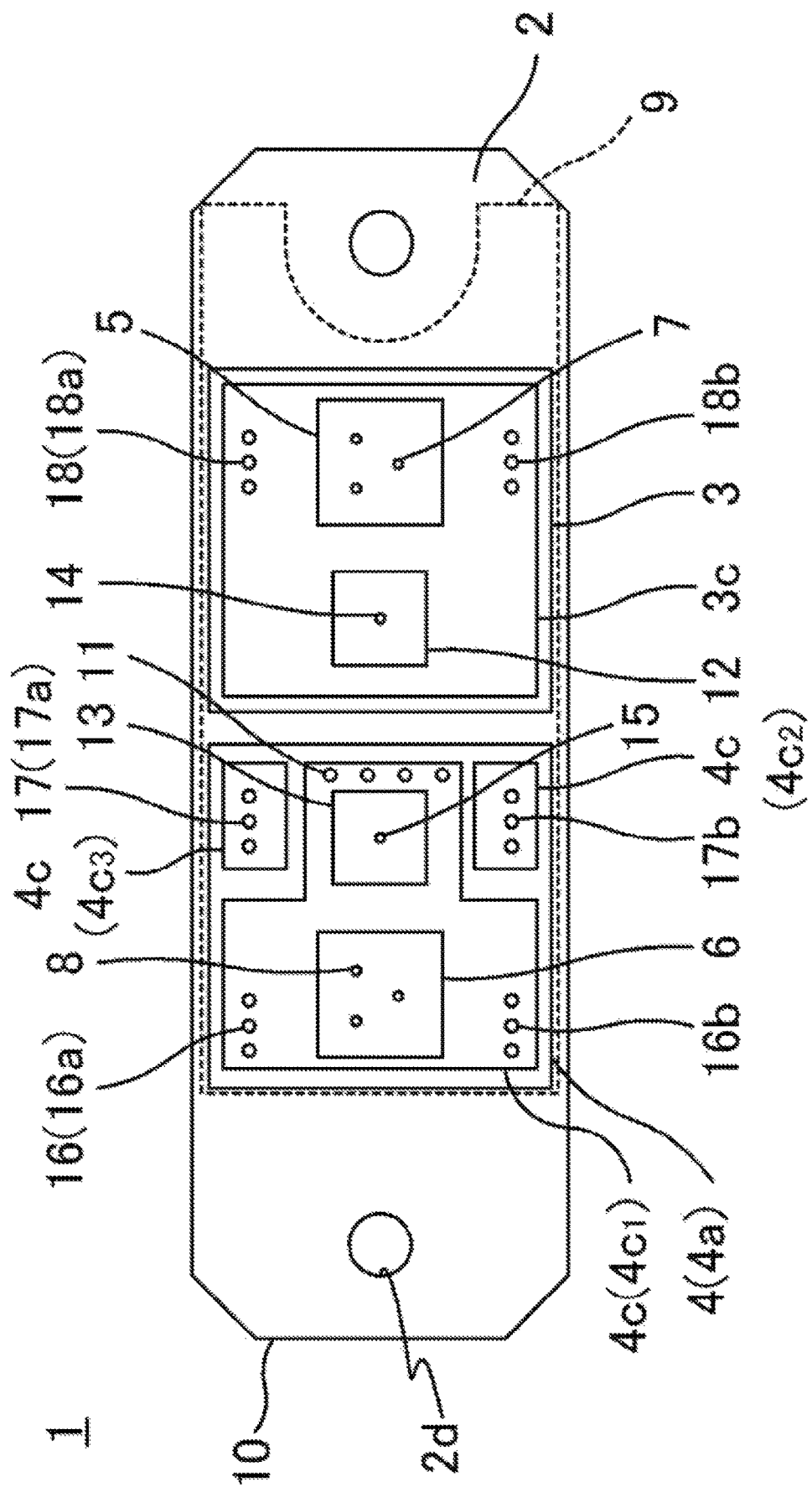
FIG. 1D is a drawing illustrating a cross-sectional configuration of the semiconductor device in the top view with regard to a reference line DD in FIG. 1B.
Figure 1E:
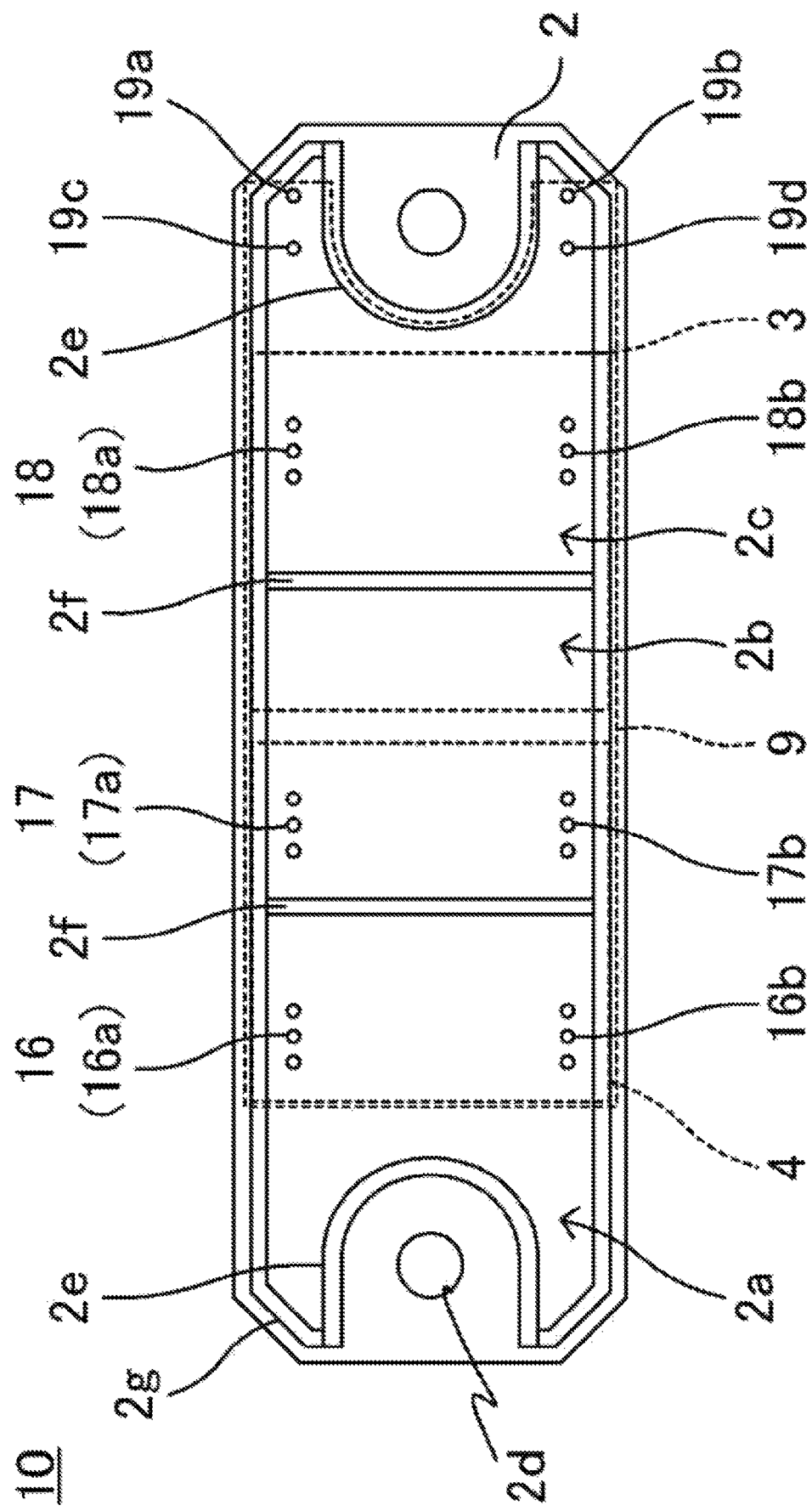
FIG. 1E is a drawing illustrating a configuration of a main body in the top view.

FIG. 1A, FIG. 1B, FIG. 1C, FIG. 1D, and FIG. 1E illustrate a configuration of a semiconductor device 1 according to the present embodiment. Herein, FIG. 1A illustrates a configuration of the semiconductor device 1 in a top view, FIG. 1B illustrates a cross-sectional configuration of the semiconductor device 1 in a side view with regard to a reference line BB in FIG. 1A, FIG. 1C illustrates a cross-sectional configuration of the semiconductor device 1 in a front view with regard to a reference line CC in FIG. 1B, FIG. 1D illustrates a cross-sectional configuration of the semiconductor device 1 in the top view with regard to a reference line DD in FIG. 1B, and FIG. 1E illustrates a configuration of the main body in the top view. It is noted that an up-and-down direction in FIG. 1A, FIG. 1D, and FIG. 1E, a direction perpendicular to a sheet plane in FIG. 1B, and a left-and-right direction in FIG. 1C are set as a vertical direction. A left-and-right direction in FIG. 1A, FIG. 1B, FIG. 1D, and FIG. 1E and a direction perpendicular to the sheet plane in FIG. 1C are set as a lateral direction. A direction perpendicular to the sheet plane in FIG. 1A, FIG. 1D, and FIG. 1E and an up-and-down direction in FIG. 1B and FIG. 1C is set as a height direction. It is noted that in these drawings and other related drawings, to simplify illustrations, reference signs with regard to a part of a plurality of the same components may be omitted in some cases.

The semiconductor device 1 is aimed at providing a semiconductor device having a standard size and shape in which a cap 20 is attached to a single semiconductor module main body 10 having a minimum thickness in accordance with a current capacity to install external terminals 26, 27, and 28 at any positions.

It is noted that in the present specification, unless otherwise specified, "connection" includes a meaning of an electrical connection so that continuity can be provided, and also includes a case where another electronic part exists in-between.

An outline of the semiconductor device 1 according to one embodiment of the present invention will be described first. The semiconductor device 1 includes a first circuit substrate 3 including a first circuit pattern layer 3c, a semiconductor element 5 mounted to the first circuit pattern layer 3c, a second circuit substrate 9 including a second circuit pattern layer 9b, a connecting pin 7 that connects the semiconductor element 5 to the second circuit pattern layer 9b, a pin-shaped terminal 17 electrically connected to the second circuit pattern layer 9b, a sealing member 2 that seals the first circuit substrate 3, the semiconductor element 5, the second circuit substrate 9, and the connecting pin 7 using resin, and the external terminal 27 including a flat plate portion 27s and an extending portion 27t that is bent from the flat plate portion 27s and extends in a direction away from the second circuit substrate 9, in which the flat plate portion 27s is connected to the pin-shaped terminal 17 and arranged in parallel with the second circuit pattern layer 9b, and the extending portion 27t is provided within a range of a width of the sealing member 2 in a transverse direction.

A sign of a rate of change of current of a current flowing through the flat plate portion 27s may be a sign inverse to a sign of a rate of change of current of a current flowing through the second circuit pattern layer 9b.

The semiconductor device 1 may also include the other external terminal 28 including another extending portion 28t electrically connected to the first circuit pattern layer 3c and arranged in parallel with the extending portion 27t.

A plurality of the pin-shaped terminals 17 may also be respectively connected to areas in the vicinity of opposite lateral sides of the flat plate portion 27s in the transverse direction of the sealing member 2.

The semiconductor device 1 includes the cap 20 including a plurality of through holes 22b and 23b that allow insertion of the extending portions 27t and 28t.

The cap 20 includes a nut accommodation portion 22 that accommodates a nut 27b. The external terminal 27 includes a through hole at an end of the extending portion 27t opposite to the flat plate portion 27s. The extending portion 27t is bent in such a manner that the through hole is arranged above the nut 27b.

The semiconductor device 1 includes the plurality of external terminals 26, 27, and 28 including flat plate portions 26s, 27s, and 28s and extending portions 26t, 27t, and 28t that are bent from the flat plate portions 26s, 27s, and 28s and extend in the direction away from the second circuit substrate 9, the cap 20 including a plurality of through holes 21b, 22b, and 23b that allow insertion of the extending portions 26t, 27t, and 28t, and insulating walls 2e, 2f, and 20d that extend from the cap 20 or the sealing member 2 and provided on outer circumferences of the flat plate portions 26s, 27s, and 28s. The flat plate portions 26s, 27s, and 28s are arranged in spaces 2a, 2b, and 2c surrounded by the cap 20, the sealing member 2, and the insulating walls 2e, 2f, and 20d.

The insulating walls 2e, 2f, and 20d include a sealing member-side insulating wall 2f that extends from the sealing member 2, and a cap-side insulating wall 20d that extends from the cap 20. A side surface of the sealing member-side insulating wall 2f is in direct contact with a side surface of the cap-side insulating wall 20d.

A length of the flat plate portion 27s of the external terminal 27 may be longer than a length of the other flat plate portion 28s of the other external terminal 28 in a longitudinal direction of the sealing member 2.

The semiconductor device 1 includes another first circuit substrate 4 arranged to be adjacent to the first circuit substrate 3, and connected to the other external terminal 28. The flat plate portion 27s of the external terminal 27 extends up to an area above the other first circuit substrate 4.

The main body 10 is a main body portion of the semiconductor device 1, and includes a casing (sealing member) 2, the circuit substrates (first circuit substrate) 3 and 4, semiconductor elements 5 and 6, connecting pins 7 and 8, a printed circuit board (second circuit substrate) 9, and pin-shaped terminals 16 to 19.

The casing (example of the sealing member) 2 is a member for sealing respective components of the semiconductor device 1 on a side of upper main surfaces (simply referred to as main surfaces) of the circuit substrates 3 and 4, that is, the components supported on those using molding therein, except that upper ends of the pin-shaped terminals 16, 17, 18, and 19 protrude upward, and lower main surfaces (referred to as lower surfaces) of the circuit substrates 3 and 4 are exposed to be flush with a bottom surface of the casing 2.

For example, the casing 2 is shaped by molding using thermosetting resin such as epoxy resin, and shaped into three dimensions including an octagonal upper surface in which a uniaxial direction (that is, the lateral direction) is set as a longitudinal direction.

Herein, a through hole 2d penetrating in the height direction is formed at both ends of the casing 2 in the lateral direction. When a fastener such as a bolt (not illustrated) is inserted into the through hole 2d from the top, the circuit substrates 3 and 4 of the semiconductor device 1 can be fixed to a plate of an external device or the like.

It is noted that a metallic plate in which an opening corresponding to the through hole 2d is formed may also be arranged in both the ends of the casing 2 in the lateral direction. In addition, the single metallic plate in which the opening is formed in both the ends in the lateral direction may also be arranged while abutting against rear surfaces of the circuit substrates 3 and 4 which will be described below. The metallic plate may also be provided with a part to be engaged with a molding material. With the use of the metallic plate, when the fastener such as the bolt (not illustrated) is inserted to fix the semiconductor device 1 to the external device or the like, the casing 2 is not damaged by application of an excess pressure.

In addition, the U-shaped insulating walls 2e respectively arranged between the through hole 2d on a left side and the pin-shaped terminal 16, and between the through hole 2d on a right side and the pin-shaped terminal 19, a sealing member-side insulating wall (simply referred to as an insulating wall as long as no particular confusion occurs) 2f that secures insulation among the pin-shaped terminals 16, 17, and 18, and an insulating wall 2g arranged along an outer circumference of the upper surface of the sealing member 2 and connected to both ends of the insulating wall 2f and an end portion of the insulating wall 2e are erected on the upper surface of the casing 2 (that is, formed so as to extend in the height direction).

With regard to the insulating wall 2e, in the top view, the end portions of the respective insulating walls 2e are installed in both the ends in the lateral direction on the upper surface of the casing 2 outwardly in the lateral direction, curved parts of the respective insulating walls 2e are installed inwardly in the lateral direction, and the through holes 2d are respectively arranged on inner sides of the curved insulating walls 2e.

The insulating wall 2f extends between the pin-shaped terminal 16 and the pin-shaped terminal 17, and between the pin-shaped terminal 17 and the pin-shaped terminal 18 in the vertical direction.

The insulating walls 2g are respectively installed while extending along two long side surfaces of the casing 2, and end portions of those are respectively connected to left and right end portions of the insulating wall 2e.

Thus, for example, as may be understood from FIG. 1E, the space 2a is compartmented on the upper surface of the casing 2 by the insulating walls 2e and 2f on the left side in the drawing and the insulating walls 2g on the top and bottom, and the space 2b is compartmented by the insulating walls 2f on the left and right and the insulating walls 2g on the top and bottom, and the space 2c is compartmented by the insulating wall 2e and the insulating wall 2f on the right side in the drawing and the insulating walls 2g on the top and bottom. It is noted that heights of the insulating walls 2e, 2f, and 2g may be arbitrarily set, and according to the present embodiment, in one example, the heights of the insulating walls 2e and 2f are set to be equal to each other, and the height of the insulating wall 2g is set to be lower with respect to those.

The circuit substrates (examples of the first circuit substrate) 3 and 4 are substrates to which the semiconductor elements 5 and 6 are respectively mounted, and a direct copper bonding (DCB) substrate, an active metal brazing (AMB) substrate, or the like can be adopted, for example.

The circuit substrate 3 includes an insulating plate 3a, a metallic layer 3b, and the circuit pattern layer 3c. The insulating plate 3a is made, for example, of insulating ceramics such as aluminum nitride, silicon nitride, or aluminum oxide and is a plate-shaped member having a thickness of 0.2 mm or higher and 1 mm or lower. The metallic layer 3b is made, for example, of a conductive metal such as copper or aluminum, is a metallic layer having a thickness of 0.1 mm or higher and 1 mm or lower, and is provided on a lower surface of the insulating plate 3a. It is noted that for a rust prevention purpose or the like, plating process may be performed on a surface of the metallic layer 3b using nickel or the like. The circuit pattern layer 3c is made of a conductive metal such as copper or aluminum as with the metallic layer 3b, and is provided on a main surface of the insulating plate 3a.

The circuit substrate 4 is constituted using a material and a thickness similar to the circuit substrate 3, and includes an insulating plate 4a, a metallic layer 4b provided on a lower surface of the insulating plate 4a, and a circuit pattern layer 4c provided on a main surface of the insulating plate 4a. It is noted however that as may be understood from FIG. 1D, the circuit pattern layer 4c includes a T-shaped circuit pattern $4c_1$ on the left side on the insulating plate 4a, and two circuit patterns $4c_2$ and $4c_3$ installed so as to sandwich a part having a narrow width in a middle of the circuit pattern $4c_1$. The circuit pattern $4c_2$ is electrically connected to a lower end of a pin-shaped terminal 17b which will be described below. The circuit pattern $4c_3$ is electrically connected to a lower end of a pin-shaped terminal 17a.

The semiconductor elements 5 and 6 are, for example, switching elements formed of a compound semiconductor such as SiC, and a vertical type insulated gate bipolar transistor (IGBT), a metal oxide silicon field effect transistor (MOSFET), or the like that has electrodes respectively on a front surface and a rear surface can be adopted. In the case of the IGBT (or the MOSFET), the semiconductor elements 5 and 6 include an emitter electrode (or a source electrode) and a gate electrode (which are collectively referred to as front surface electrodes) on the front surface, and a collector electrode (or a drain electrode (neither of which are illustrated)) on the rear surface. The semiconductor element 6 is mounted on the circuit pattern $4c_1$ by a bonding material such as soldering (not illustrated), and bonded to the main surface of the circuit substrate 4 on a rear surface of the semiconductor element 6. Similarly, the semiconductor element 5 is mounted on the circuit pattern 3c by a bonding material such as soldering (not illustrated), and bonded to the main surface of the circuit substrate 3 on a rear surface of the semiconductor element 5. It is noted that according to the present embodiment, in one example, the IGBTs are used as the semiconductor elements 5 and 6.

It is noted that the semiconductor elements 5 and 6 and diodes 12 and 13 may also be respectively divided into a plurality of semiconductor elements and diodes and connected in parallel.

The diodes 12 and 13 are rectifying elements mounted on the circuit substrates 3 and 4 as free wheel diodes (FWDs) and respectively connected in inverse parallel to the semiconductor elements 5 and 6, and Schottky barrier diodes (SBDs) or the like formed of a compound semiconductor such as SiC are used, for example. A lower surface of the diode 12 is electrically connected to the circuit pattern layer 3c. A lower surface of the diode 13 is electrically connected to the circuit pattern layer $4c_1$. A connecting pin 14 electrically connects an upper surface electrode of the diode 12 to a circuit pattern layer $9b_1$. A connecting pin 15 electrically connects an upper surface electrode of the diode 13 to a circuit pattern layer $9b_2$.

It is noted that a reverse conducting IGBT (RC-IGBT) chip in which a semiconductor element and a diode are built in a single chip and connected in inverse parallel may also be used as a substitute of the semiconductor element 5 and the diode 12, or the semiconductor element 6 and the diode 13.

The connecting pins 7 and 8 are pin-shaped conductive members that provide electrical connection between the circuit pattern layers 3c and 4c of the respective circuit substrates 3 and 4 or the respectively mounted front surface electrodes of the semiconductor elements 5 and 6 (according to the present embodiment, in one example, the front surface electrodes of the semiconductor elements 5 and 6) and the circuit pattern layer 9b of the printed circuit board 9 which will be described below, and are shaped into a pin shape such as a column using the conductive metal such as copper or aluminum in one example. It is noted that the connecting pins 7 and 8 have lower ends connected to the semiconductor elements 5 and 6 using a bonding material such as soldering (not illustrated) to be erected on the front surface electrodes of those, and have upper ends connected to the circuit pattern layer 9b of the printed circuit board 9 by soldering, brazing, or caulking.

Both the connecting pins 7 and 8 include a plurality of posts, and in one example, include three posts each. Two posts each among those are erected on the emitter electrodes of the semiconductor elements 5 and 6, and connected to emitter-side wirings (circuit pattern layers $9b_1$ and $9b_2$) of the circuit pattern layer 9b of the printed circuit board 9. The remaining posts of the respective semiconductor elements are erected on the gate electrodes of the semiconductor elements 5 and 6, and connected to gate wirings (circuit pattern layers $9b_3$ and $9b_4$) of the circuit pattern layer 9b of the printed circuit board 9.

The printed circuit board (example of a second circuit substrate) 9 includes an insulating plate 9a, and the circuit pattern layer 9b (example of a second circuit pattern layer) that forms a circuit pattern on a main surface of the insulating plate 9a. In detail, the circuit pattern layer 9b includes the circuit pattern layer $9b_1$ that provides connection between the connecting pin 7 and a connecting pin 11 which will be described below, the circuit pattern layer $9b_2$ that provides connection between a connecting pin 8 and the pin-shaped terminal 17, the circuit pattern layer $9b_3$ serving as the gate wiring of the semiconductor element 5, and the circuit pattern layer $9b_4$ serving as the gate wiring of the semiconductor element 6.

The circuit pattern layer $9b_1$ is electrically connected to the emitter electrode of the semiconductor element 5 (source electrode in the case of the MOSFET) via the connecting pin 7.

The circuit pattern layer $9b_2$ is electrically connected to the emitter electrode of the semiconductor element 6 (source electrode in the case of the MOSFET) via the connecting pin 8.

The printed circuit board (example of the second circuit substrate) 9 is a substrate where wirings that connect the electrodes of the semiconductor elements 5 and 6 to the pin-shaped terminals 16 to 19 are provided, and is arranged on a side of the main surfaces of the circuit substrates 3 and 4 to be away from these. According to the present embodiment, the printed circuit board 9 is arranged between the main surfaces of the circuit substrates 3 and 4 and the flat plate portions 26s, 27s, and 28s of the respective external terminals 26, 27, and 28 connected to the pin-shaped terminals 16, 17, and 18 which will be described below. A rigid substrate constituted by a glass epoxy material or a flexible substrate constituted by a polyimide material can be adopted as the insulating plate 9a, for example. A plurality of through holes (not illustrated) through which the connecting pins 7 and 8 and the pin-shaped terminals 16, 17, 18, and 19 pass are provided in the printed circuit board 9. The circuit pattern layer 9b is made of a conductive metal such as copper or aluminum, and is provided on the surface of the insulating plate 9a.

The connecting pin 11 electrically connects the circuit pattern layer $9b_1$ to the circuit pattern layer $4c_1$.

The pin-shaped terminals 16, 17, and 18 are input and output terminals used for inputting and outputting a current for providing continuity to the semiconductor elements 5 and 6 with respect to the semiconductor device 1. The pin-shaped terminals 19 (19a, 19b) are gate terminals electrically connected to the gate electrodes of the semiconductor elements 5 and 6, and the pin-shaped terminals 19 (19c, 19d) are auxiliary emitter terminals electrically connected to the emitter electrodes of the semiconductor elements 5 and 6. In one example, these pin-shaped terminals 16, 17, 18, and 19 are shaped into a plate shape or a pin shape such as a columnar shape using the conductive metal such as copper or aluminum.

The pin-shaped terminal 16 has one end connected to the circuit pattern layer $4c_1$ of the circuit substrate 4 and the other end exposed from the casing 2. The pin-shaped terminal 16 includes a plurality of pin-shaped terminals, and in one example, includes six pin-shaped terminals. Three pieces each of pin-shaped terminals (examples of first and second pin-shaped terminals) 16a and 16b are respectively erected on one side and the other side in the vertical direction on the circuit pattern $4c_1$, extend upward via a hole portion (not illustrated) of the printed circuit board 9, and respectively protrude from the upper surface of the casing 2 on one side and the other side in the vertical direction in the space 2a. Accordingly, the plurality of pin-shaped terminals 16a and 16b are respectively arrayed on one side and the other side in the vertical direction on the main body 10 (casing 2) in the lateral direction, and the collector electrode of the semiconductor element 6 is connected to the external terminal 26 which will be described below via the circuit pattern $4c_1$ and the pin-shaped terminal 16. In addition, the emitter electrode of the semiconductor element 5 is connected to the external terminal 26 which will be described below via the connecting pin 7, the circuit pattern layer $9b_1$ of the printed circuit board 9, the connecting pin 11, the circuit pattern $4c_1$, and the pin-shaped terminal 16.

Figure 4A:
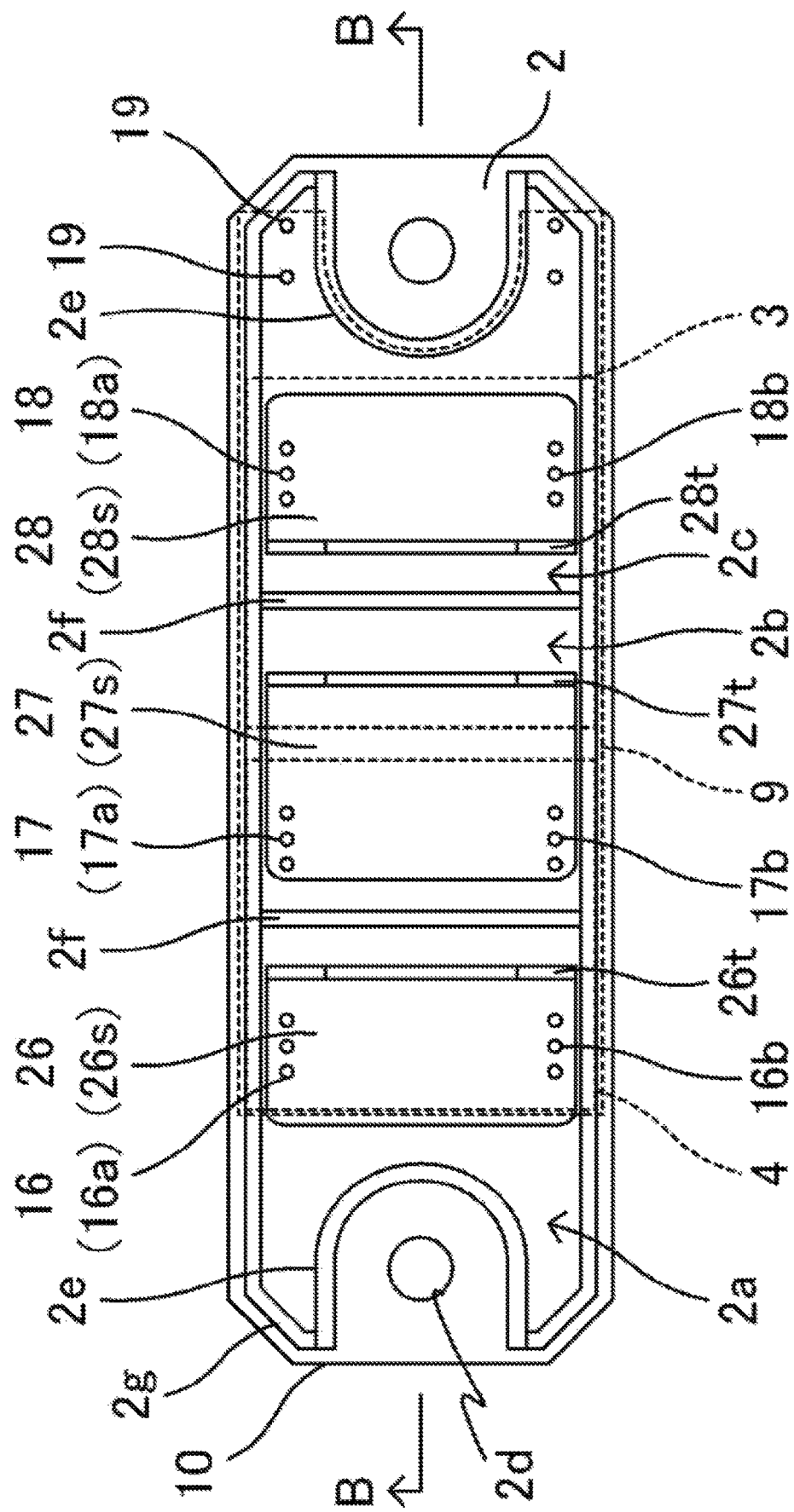
FIG. 4A is a diagram illustrating a state where an external terminal is connected to a pin-shaped terminal of the main body.

The pin-shaped terminal 17 includes the pin-shaped terminal 17a having one end connected to the circuit pattern layer $4c_3$ of the circuit substrate 4 and the other end exposed from the casing 2, and the pin-shaped terminal 17b having one end connected to the circuit pattern layer $4c_2$ of the circuit substrate 4 and the other end exposed from the casing 2. The pin-shaped terminals 17a and 17b may also be one terminal each, or may also be plural terminals each, in accordance with the input and output power. As illustrated in FIG. 4A, three pieces each of pin-shaped terminals (examples of first and second pin-shaped terminals) 17a and 17b are respectively erected on one side and the other side in the vertical direction on the circuit pattern $4c_2$, extend upward via the hole portion (not illustrated) of the printed circuit board 9, and respectively protrude from the upper surface of the casing 2 on one side and the other side in the vertical direction in the space 2b. Accordingly, the plurality of pin-shaped terminals 17a and 17b are respectively arrayed on one side and the other side in the vertical direction on the upper surface of the main body 10 (casing 2) in the lateral direction, and the emitter electrode of the semiconductor element 6 is connected to the external terminal 27 which will be described below via the connecting pin 8, the circuit pattern layer $9b_2$ of the printed circuit board 9, and the pin-shaped terminals 17a and 17b.

The pin-shaped terminal 18 has one end connected to the circuit pattern layer 3c of the circuit substrate 3 and the other end exposed from the casing 2. The pin-shaped terminal 18 includes a plurality of pin-shaped terminals, and in one example six pin-shaped terminals. Three pieces each of pin-shaped terminals (examples of the first and second pin-shaped terminals) 18a and 18b are respectively erected on one side and the other side in the vertical direction on the circuit pattern layer 3c, extend upward via the hole portion (not illustrated) of the printed circuit board 9, and respectively protrude from the upper surface of the casing 2 on one side and the other side in the vertical direction in the space 2c. Accordingly, the plurality of pin-shaped terminals 18a and 18b are respectively arrayed on one side and the other side in the vertical direction on the upper surface of the main body 10 (casing 2) in the lateral direction, and the collector electrode of the semiconductor element 5 is connected to the external terminal 28 which will be described below via the circuit pattern layer 3c and the pin-shaped terminal 18.

The pin-shaped terminals 19a and 19b have proximal ends connected to the respective gate wirings $9b_3$ and $9b_4$ of the circuit pattern layer 9b of the printed circuit board 9 and respectively electrically connected to the gate electrodes of the semiconductor elements 5 and 6 via the gate wirings, and have the other end exposed from the casing 2. The pin-shaped terminals 19a and 19b respectively protrude from the casing 2 while sandwiching the insulating wall 2e from the upper surface of the casing 2. Accordingly, the pin-shaped terminals 19a and 19b are respectively connected to the gate electrodes of the semiconductor elements 5 and 6 via the circuit pattern layers 9b ($9b_3$, $9b_4$) serving as the gate wirings of the printed circuit board 9 and the connecting pins 7 and 8, and function as the gate terminals. The pin-shaped terminals 19c and 19d are electrically connected to the emitter electrodes of the semiconductor elements 5 and 6 via the printed circuit board 9 or the like to form the auxiliary emitter terminals.

The cap 20 is a member arranged to set the semiconductor device 1 to have the standard size and shape by being attached to the main body 10, that is, on the side of the upper surface of the casing 2. It is noted that a thickness of the cap 20 may also be arbitrarily selected. For example, the cap 20 is shaped using the thermosetting resin such as epoxy resin and formed into an octagonal shape in which the uniaxial direction (that is, the lateral direction) is set as a longitudinal direction to have a lid shape including an upper surface on which semi-obround notches 20a are provided in both the ends in the lateral direction. Herein, nut accommodation portions 21 to 23, through holes 21b to 23b, cap-side insulating walls 20c and 20d, and a convex portion 29s are provided in the cap 20.

The nut accommodation portions 21, 22, and 23 are convex portions corresponding to the respective external terminals 26, 27, and 28 and accommodating, for example, nuts 26b, 27b, and 28b for fixing conductive members such as busbars that mutually connect the external terminals 26, 27, and 28 between a plurality of the semiconductor devices 1. The nut accommodation portions 21, 22, and 23 are juxtaposed on an upper surface of the cap 20 in the lateral direction. The nut accommodation portions 21, 22, and 23 respectively have nut holes 21a, 22a, and 23a formed on inner sides in such a manner that a substantially rectangular region on the upper surface of the cap 20 protrudes upward in the height direction, a hexagonal region in a middle of the rectangular region is depressed downward, and furthermore, a circular region in a middle of the hexagonal region is further depressed downward. The hexagonal nuts 26b, 27b, and 28b can be respectively inserted into the respective nut holes 21a, 22a, and 23a while female screws are directed in the height direction.

Figure 5A:
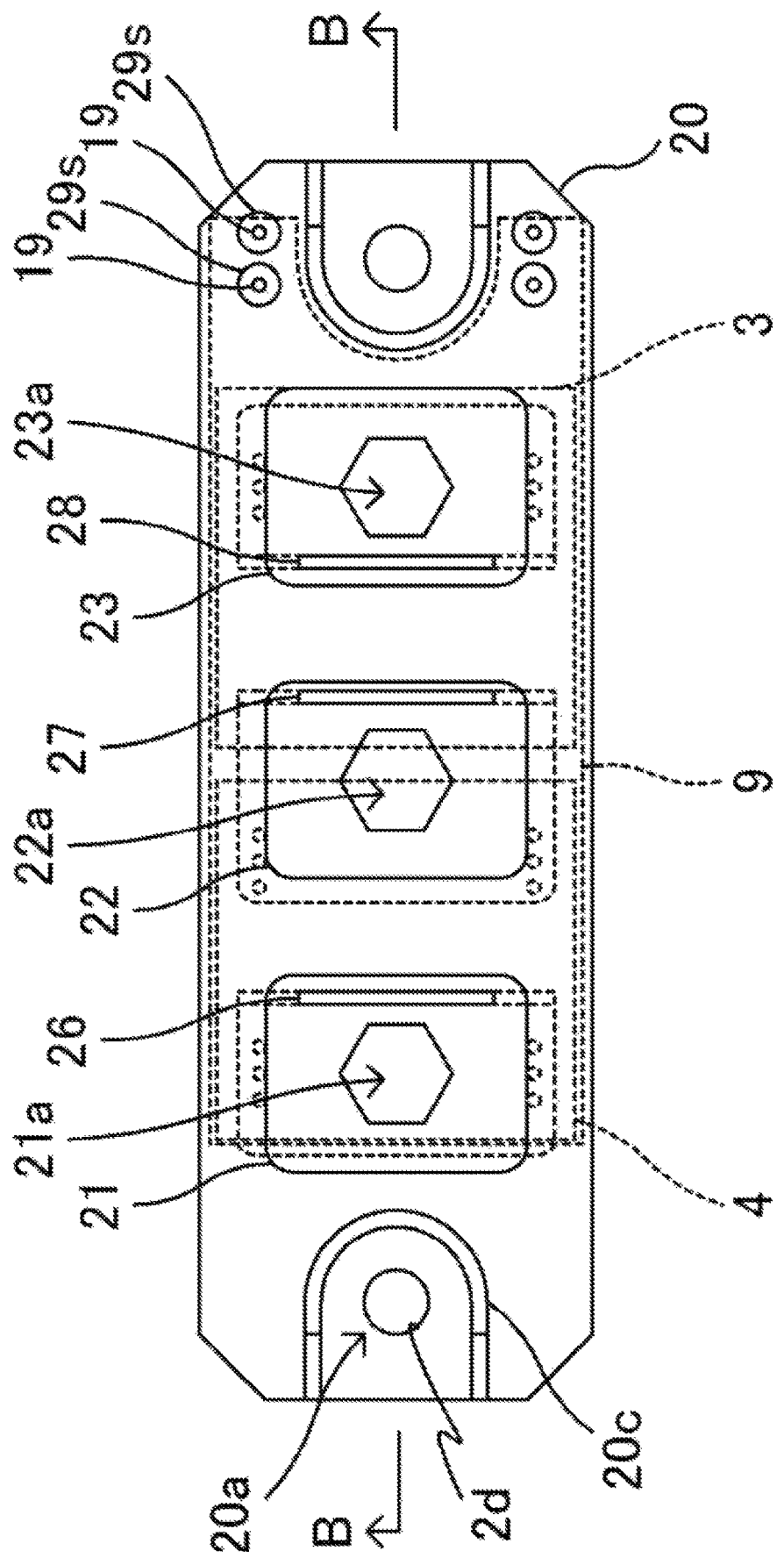
FIG. 5A is a diagram illustrating a state where a cap is put on the main body.
Figure 5B:
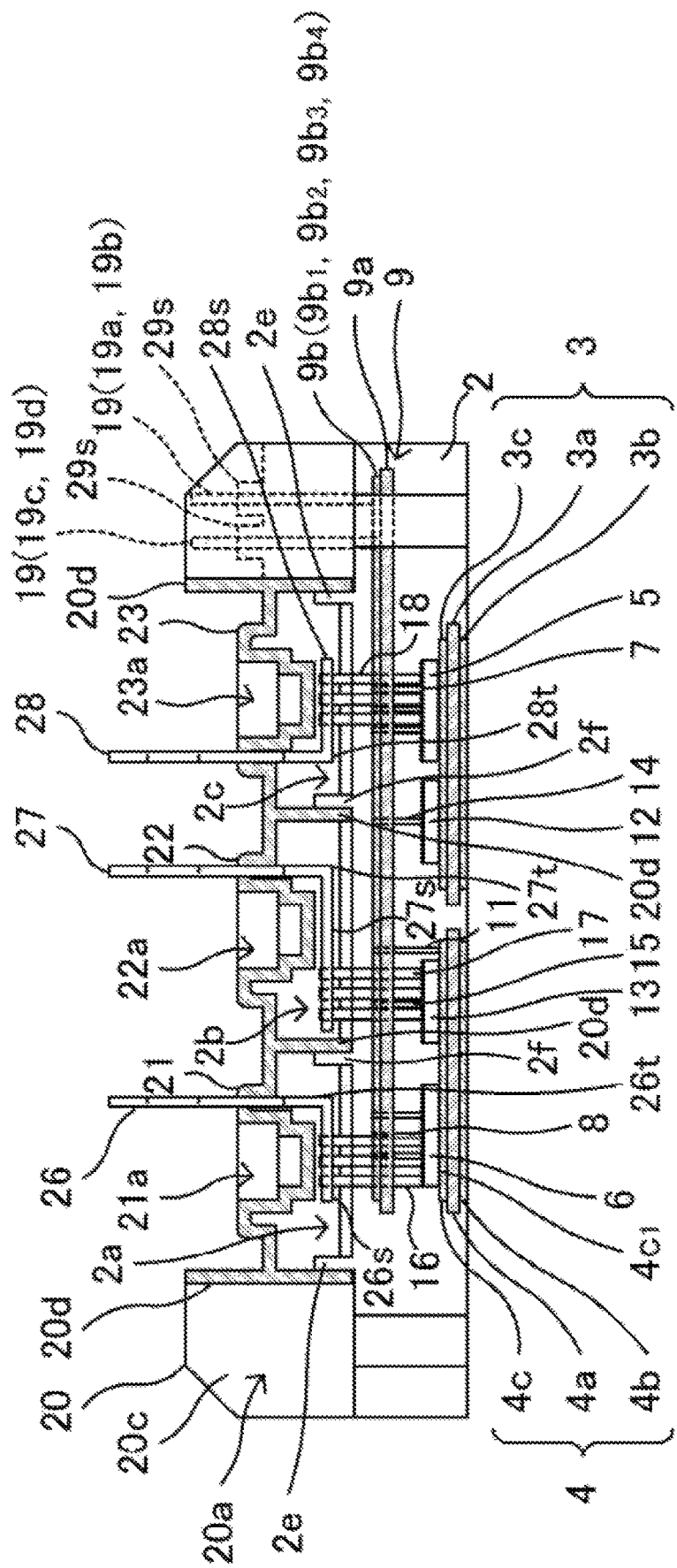
FIG. 5B is a diagram illustrating a state where the cap is put on the main body with regard to the reference line BB in FIG. 5A.

As illustrated in FIG. 1A and FIG. 1B, the through holes 21b, 22b, and 23b are the hole portions that allow insertion of the extending portions 26t, 27t, and 28t of the respective external terminals 26, 27, and 28, and are respectively formed by opening the right sides of the nut accommodation portions 21 and 22 in the lateral direction and the left side of the nut accommodation portion 23 in the lateral direction in a rectangular shape in which the vertical direction is set as a longitudinal direction. As illustrated in FIG. 5A and FIG. 5B, leading ends of the L-shaped external terminals 26, 27, and 28, that is, the extending portions 26t, 27t, and 28t are inserted from the lower side through the respective through holes 21b, 22b, and 23b in the height direction, and bent above the nut accommodation portions 21, 22, and 23 after the nut is inserted into the nut accommodation portion 21, so that the external terminals 26, 27, and 28 are fixed to the nut accommodation portions 21, 22, and 23. In this manner, through holes 26a, 27a, and 28a of the external terminals 26, 27, and 28 are positioned onto the nuts 26b, 27b, and 28b accommodated in the nut holes 21a, 22a, and 23a.

The cap-side insulating wall (simply referred to as an insulating wall as long as no particular confusion occurs) 20c is a part where insulation is secured on a lower side of the semiconductor device 1, that is, the external terminals 26, 27, and 28 and the pin-shaped terminal 19 with respect to the external device or the like to which the semiconductor device 1 is attached. The insulating wall 20c is shaped into a plate shape curved in a semi-obround manner in the top view, and fixed in the semi-obround notches 20a provided in both the ends of the cap 20 in the lateral direction in the middle of the height direction. When the cap 20 is attached onto the upper surface of the main body 10, the insulating wall 20c has a lower end fitted into the insulating wall 2e on the upper surface of the casing 2 to form a stepped portion including an upper surface that is lower than the upper surface of the cap 20 on the inner side. The lower end of the insulating wall 20c is overlapped with the insulating wall 2e in the vertical direction and the lateral direction. Thus, the upper surface of the casing 2 is isolated from an outer side of the cap 20, and insulating distances from the lower side of the semiconductor device 1 up to the external terminals 26, 27, and 28 and the pin-shaped terminals 19 are obtained.

The cap-side insulating wall (simply referred to as an insulating wall as long as no particular confusion occurs) 20d is a part where insulation is secured on the inner side of the semiconductor device, that is, among the pin-shaped terminals 16, 17, and 18 and the external terminals 26, 27, and 28 connected to these on the upper surface of the main body 10. The insulating wall 20d includes two wall portions extending in the vertical direction which are respectively formed by extending downward between the nut accommodation portions 21 and 22 and between the nut accommodation portions 22 and 23 (that is, towards the casing 2) on an inner surface of the cap 20. When the cap 20 is attached onto the upper surface of the main body 10, the insulating wall 20d has a lower end engaged into the insulating wall 2f on the upper surface of the casing 2 to be overlapped with the insulating wall 2f in the lateral direction. Thus, a space between the cap 20 and the main body 10 (casing 2) is segmented into the three spaces 2a, 2b, and 2c on the casing 2 corresponding to the nut accommodation portions 21, 22, and 23, and the pin-shaped terminals 16, 17, and 18 and the external terminals 26, 27, and 28 connected to these which are located in the respective spaces are mutually isolated.

The convex portion 29s is a part that causes the pin-shaped terminal 19 to protrude above the cap 20 and supports this. Two pieces each of the convex portions 29s are juxtaposed in the lateral direction on one side and the other side in the vertical direction on the upper surface of the cap 20 while sandwiching the insulating wall 20c on the right side in the lateral direction. Each of the convex portions 29s has a cylindrical shape, and a through hole (not illustrated) penetrating through in the height direction is formed in its center. When the cap 20 is attached onto the upper surface of the main body 10, the pin-shaped terminal 19 that protrudes in the height direction from the upper surface of the main body 10 passes through the through hole to be fed onto the cap 20.

The external terminals (examples of an external terminal portion) 26, 27, and 28 are conductive members respectively connected to the pin-shaped terminals 16, 17, and 18 of the main body 10 to cause these to extend onto the upper surface of the cap 20 and respectively function, for example, as a U terminal, an N terminal, and a P terminal. In one example, the external terminals are shaped into a plate shape using the conductive metal such as copper or aluminum. The external terminals 26, 27, and 28 respectively include the flat plate portions 26s, 27s, and 28s formed by bending plate-shaped members, and the extending portions 26t to 28t connected to one ends of these flat plate portions. Through holes (see FIGS. 4A and 4B) (herein, three each on the top and the bottom) that allow insertion of at least one (herein, three each on the top and the bottom) pin-shaped terminal included in one terminal among the pin-shaped terminals 16, 17, and 18 are respectively formed on both sides in a width direction in the one ends of the flat plate portions 26s, 27s, and 28s. The extending portions 26t, 27t, and 28t include leading ends that are narrower than proximal ends and connected to the flat plate portions 26s, 27s, and 28s, and the circular through holes 26a, 27a, and 28a are respectively formed in the leading ends.

Lengths of the flat plate portions 26s, 27s, and 28s of the external terminals 26, 27, and 28 in the lateral direction may mutually vary, and lengths of a part of the flat plate portions may also be different from the other flat plate portion.

According to the present embodiment, in one example, the flat plate portion 27s of the external terminal 27 is set to be longer than the flat plate portion 26s of the external terminal 26 and the flat plate portion 28s of the external terminal 28. Accordingly, irrespective of the arrangement of the pin-shaped terminals 16, 17, and 18 in the main body 10, in accordance with the arrangement of the external terminals 26, 27, and 28 on the cap 20 (that is, the arrangement of the nut accommodation portions 21, 22, and 23), the pin-shaped terminals 16, 17, and 18 can be respectively connected to the external terminals 26, 27, and 28. Then, since the wiring with which the flat plate portion 27s of the external terminal 27 and the circuit pattern layer $9b_1$ of the printed circuit board 9 are arranged in parallel is lengthened, the mutual inductance can be reduced.

It is noted that as described above, each of the external terminals 26, 27, and 28 is connected to any one of the circuit substrates 3 and 4. Herein, the external terminal 27 among the external terminals 26, 27, and 28 is connected to the circuit substrate 3 via the pin-shaped terminal 17 and extends up to an area above the circuit substrate 4. Accordingly, irrespective of the arrangement of the pin-shaped terminal 17 in the main body 10, that is, irrespective of the configuration and the arrangement of the circuit substrates 3 and 4, in accordance with the arrangement of the external terminal 27 (that is, the arrangement of the nut accommodation portion 22) on the cap 20, the external terminal 27 can be connected to the circuit substrate 3.

The external terminals 26, 27, and 28 are fixed to the nut accommodation portions 21, 22, and 23 of the cap 20 in such a manner that the flat plate portions 26s, 27s, and 28s are horizontally held, the pin-shaped terminals 16, 17, and 18 of the main body 10 are inserted through the respectively formed through holes (see FIG. 4A and FIG. 4B) and connected to these, the cap 20 is put onto the main body 10, and the extending portions 26t, 27t, and 28t are inserted through the respective through holes 21b, 22b, and 23b from the lower side in the height direction and bent above the nut accommodation portions 21, 22, and 23. Thus, the flat plate portions 26s, 27s, and 28s and the proximal ends of the extending portions 26t, 27t, and 28t of the respective external terminals 26, 27, and 28 are provided within the spaces 2a, 2b, and 2c on the inner side of the cap 20 on the side of the upper surface of the main body 10 (casing 2), that is, within the ranges of the widths of those in the transverse direction, and mutually insulated. Then, the extending portion 27t is provided within the range of the width of the sealing member 2 in the transverse direction.

In addition, the extending portions 26t, 27t, and 28t of the external terminals 26, 27, and 28 are arrayed on the side of the upper surface of the main body 10 (casing 2) in the lateral direction, and in particular, the mutually adjacent extending portions 27t and 28t of the external terminals 27 and 28 respectively functioning as the N terminal and the P terminal face each other. Herein, with regard to the external terminal (example of a first or second external terminal portion) 28 and the external terminal (example of the second or first external terminal portion) 27 that are mutually adjacent in the lateral direction among the external terminals 26, 27, and 28, directions of currents flowing through the extending portions 27t and 28t may become the same direction in parallel by a feedback current generated at the time of a switching operation of the semiconductor device 1, and rate of change of currents may have inverse signs in some occasions. Thus, the wirings of the extending portions 27t and 28t are transformed into the mutual inductance, and the inductances can be suppressed. For this reason, the high speed operation of the semiconductor device 1 can be performed.

In addition, the flat plate portions 26s, 27s, and 28s of the external terminals 26, 27, and 28 face at least a part of the circuit pattern layer 9b of the printed circuit board 9. Among those, for example, a current flows through the flat plate portion 27s of the external terminal 27 in the same direction in parallel with the circuit pattern layer $9b_1$ of the printed circuit board 9. Thus, due to the transformation into the mutual inductance, wiring inductances with respect to the flat plate portion 27s and the circuit pattern layer $9b_1$ of the printed circuit board 9 are suppressed, and the high speed operation of the semiconductor device 1 can be performed.

In addition, the respective hole portions 26a, 27a, and 28a are positioned onto the nut holes 21a, 22a, and 23a, and communicatively connected with the female screws of the nuts 26b, 27b, and 28b in the height direction which are respectively inserted into the nut holes 21a, 22a, and 23a. In view of the above, when volts (not illustrated) corresponding to an example of a fastener are threaded into the female screws of the nuts 26b, 27b, and 28b through the nut holes 21a, 22a, and 23a via conductive members (not illustrated) that provide connection to another semiconductor device or the like, the conductive members can be detachably connected to the external terminals 26, 27, and 28.

Figure 2A:
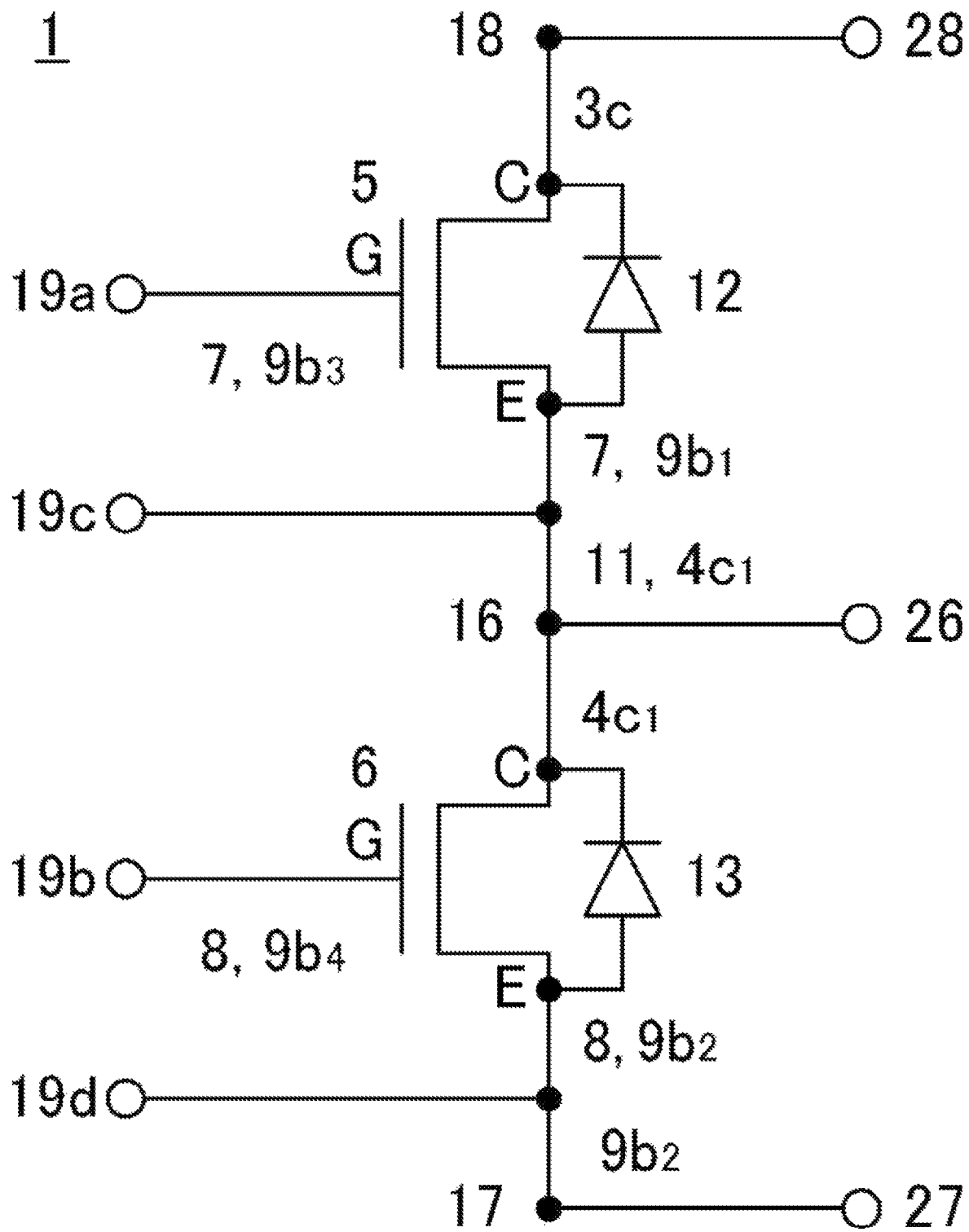
FIG. 2A illustrates a circuit configuration of the semiconductor device according to the present embodiment.

FIG. 2A illustrates a circuit configuration of the semiconductor device 1. In the semiconductor device 1, the semiconductor elements 5 and 6 are connected in series between the external terminals 27 and 28, and the external terminal 26 is connected between the semiconductor element 5 and the semiconductor element 6.

Herein, the collector electrode of the semiconductor element 5 is connected to the external terminal 28 via the circuit pattern layer 3c and the pin-shaped terminal 18. The emitter electrode of the semiconductor element 5 is connected to the pin-shaped terminal 16 via the connecting pin 7, the circuit pattern layer $9b_1$, the connecting pin 11, and the circuit pattern layer $4c_1$. In addition, the pin-shaped terminal 19c is electrically connected to the emitter electrode of the semiconductor element 5. The diode 12 is connected to the semiconductor element 5 in inverse parallel. The pin-shaped terminal 16 is connected to the external terminal 26. The collector electrode of the semiconductor element 6 is connected to the pin-shaped terminal 16 via the circuit pattern layer $4c_1$. The emitter electrode of the semiconductor element 6 is connected to the pin-shaped terminal 17 via the connecting pin 8 and the circuit pattern layer $9b_2$. In addition, the pin-shaped terminal 19d is electrically connected to the emitter electrode of the semiconductor element 6. The diode 13 is connected to the semiconductor element 6 in inverse parallel. The pin-shaped terminal 17 is connected to the external terminal 27.

Figure 2B:
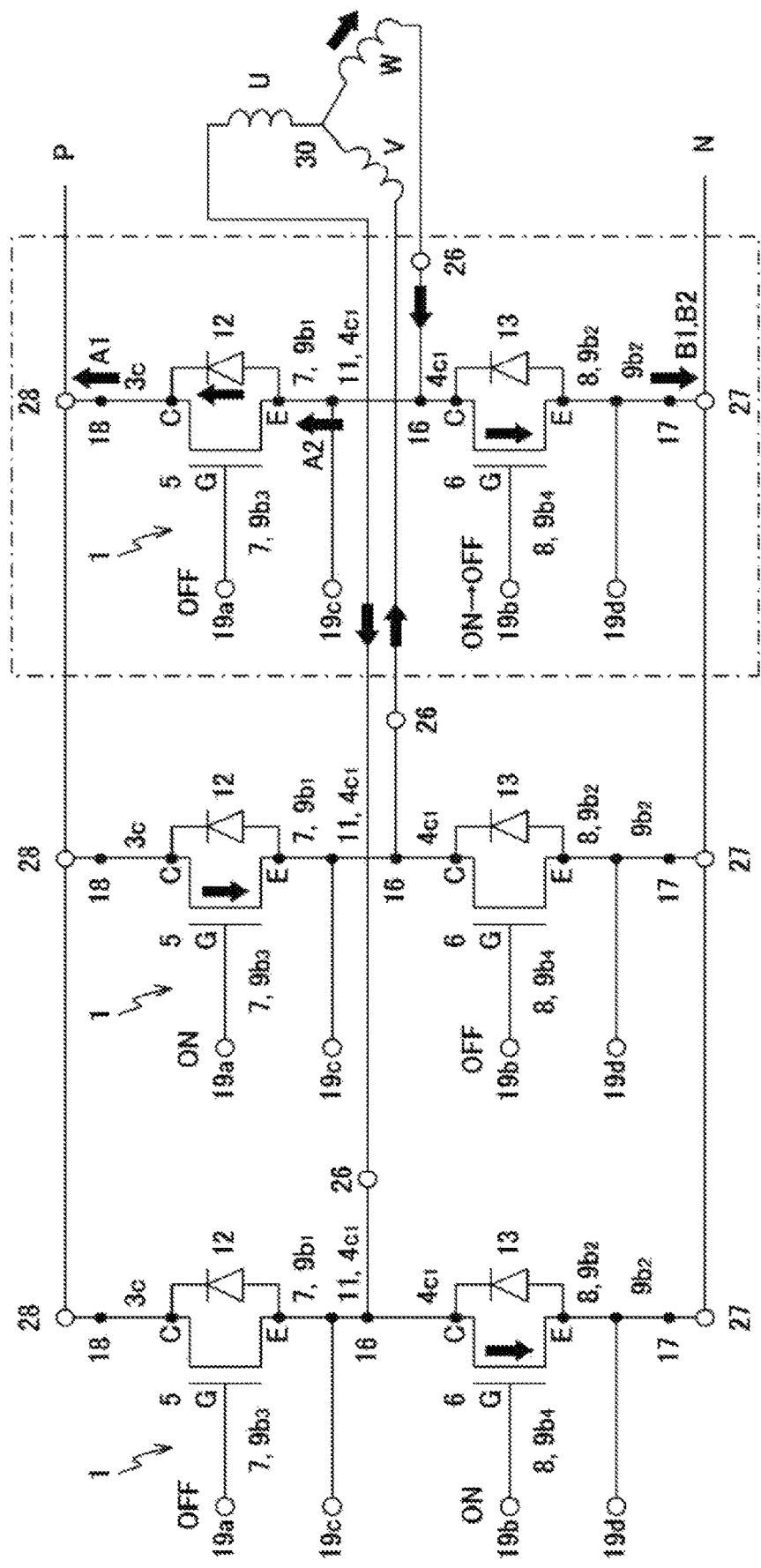
FIG. 2B is a diagram illustrating an example of a circuit configuration of a three-phase inverter and a motor to which the semiconductor device according to the present embodiment is combined, and illustrating a current at the time of a switching operation.
Figure 2C:
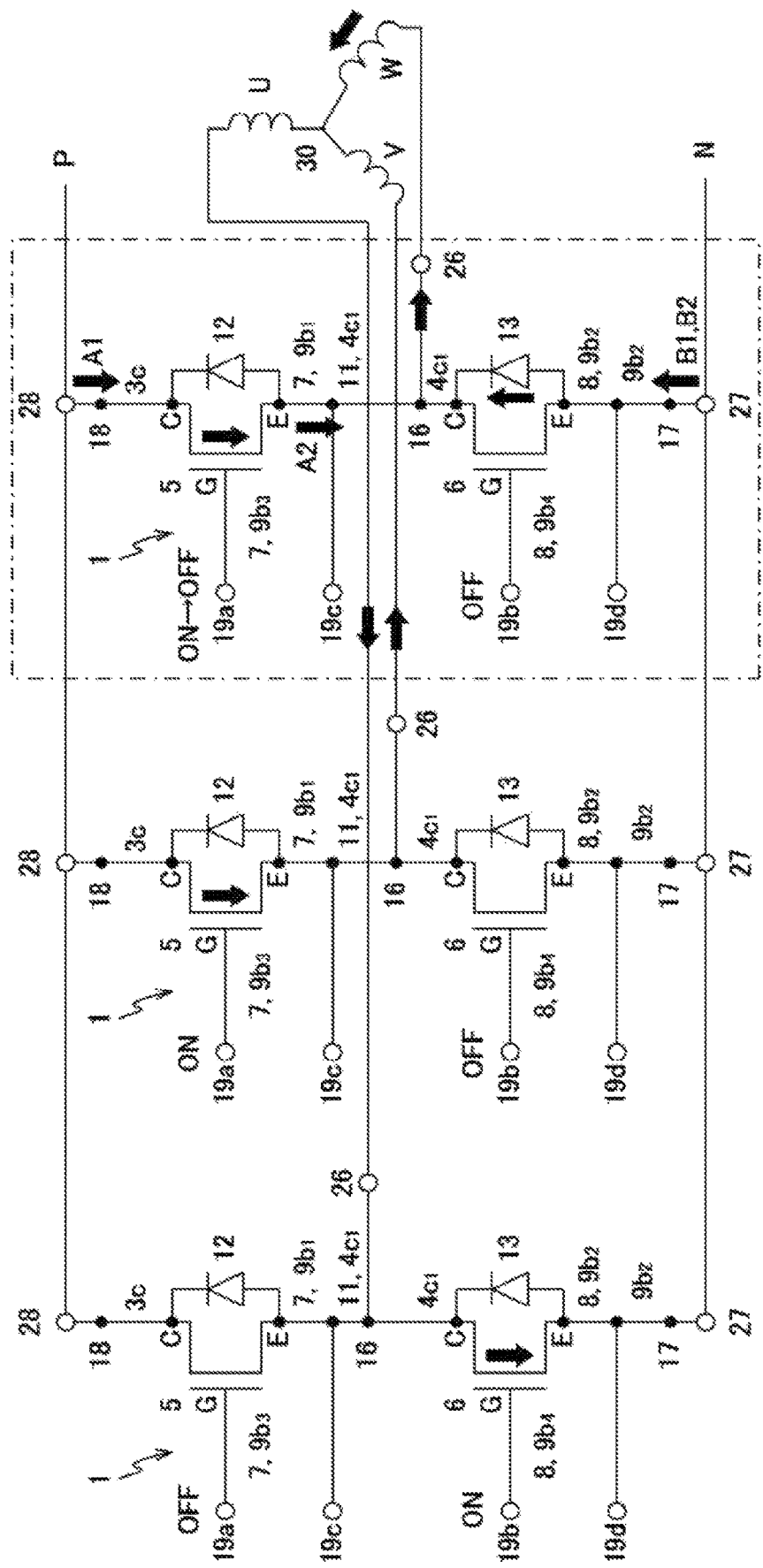
FIG. 2C is a diagram illustrating an example of the circuit configuration of the three-phase inverter and the motor to which the semiconductor device according to the present embodiment is combined, and illustrating a current at the time of another switching operation.
Figure 3A:
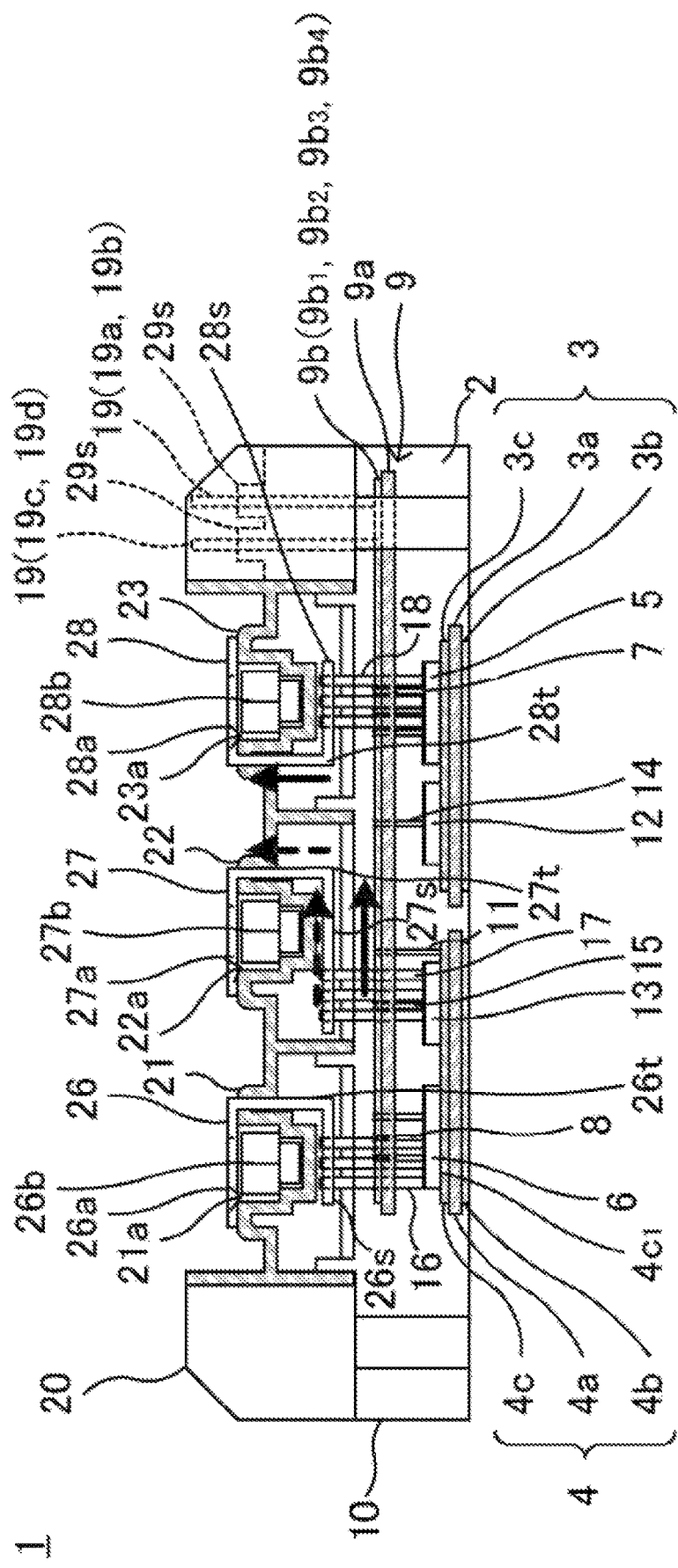
FIG. 3A is a diagram illustrating directions of currents in current-carrying parts related to transformation into a mutual inductance at the time of the switching operation illustrated in FIG. 2B.
Figure 3B:
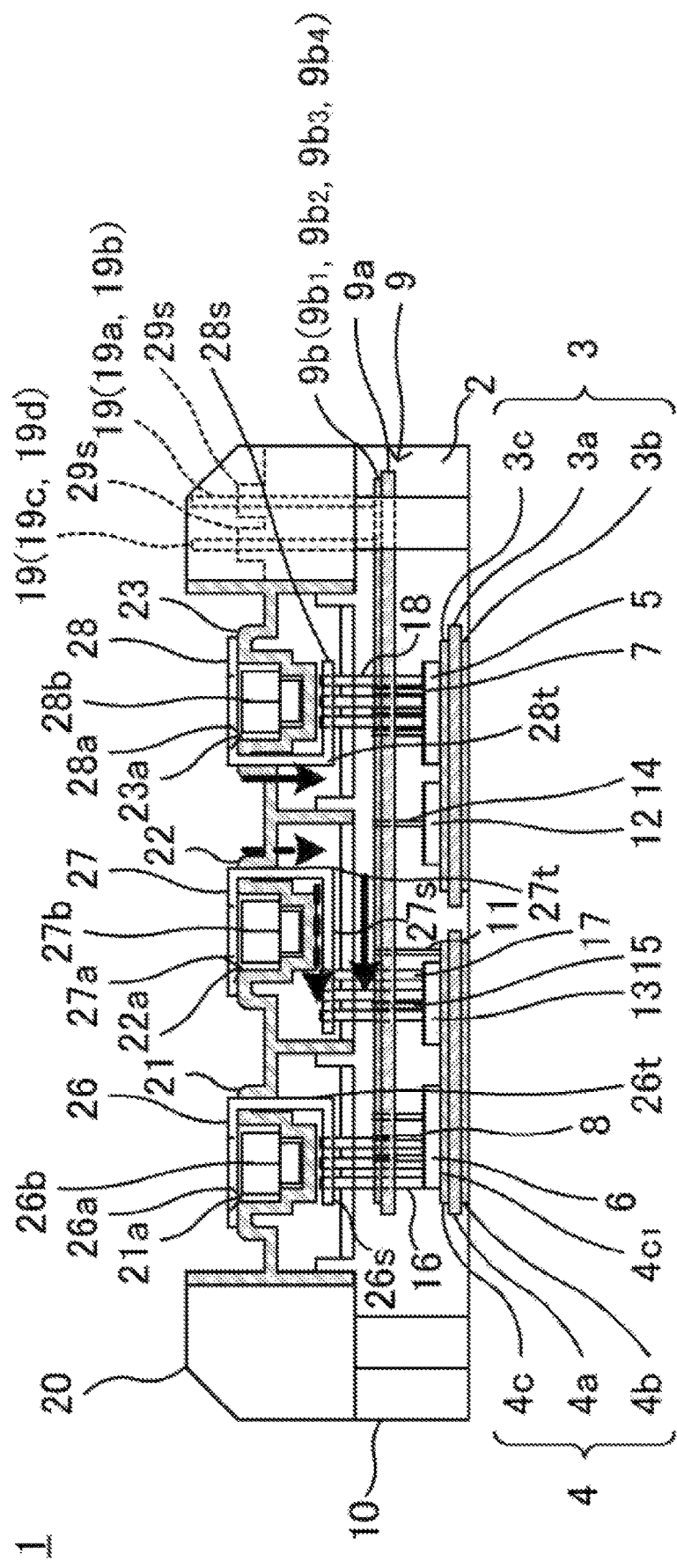
FIG. 3B is a diagram illustrating directions of currents in the current-carrying parts related to transformation into a mutual inductance at the time of the other switching operation illustrated in FIG. 2C.

FIG. 2B and FIG. 2C are diagrams illustrating an example of a circuit configuration of a three-phase inverter and a motor 30 to which the semiconductor device 1 according to the present embodiment is combined, and illustrating currents at the time of respectively different switching operations using arrows. In addition, FIG. 3A and FIG. 3B are diagrams respectively illustrating directions of currents in current-carrying parts related to transformation into a mutual inductance corresponding to the states illustrated in FIG. 2B and FIG. 2C. The external terminals 28 of the respective semiconductor devices 1 are connected to a side of a P electrode of a direct-current power supply, and the external terminals 27 of the respective semiconductor devices 1 are connected to a side of an N electrode of the direct-current power supply. The external terminals 26 of the respective semiconductor devices 1 are respectively connected to U, V, and W terminals of the three-phase motor 30. FIG. 2B and FIG. 2C represent two switching states when ON and OFF control is performed by a pulse width modulation (PWM) method.

FIG. 2B illustrates an intermediate state at the time of phase switching, and illustrates current flows using arrows when the semiconductor element 6 of a lower arm on the right side is switched from a switch-on state to a switch-off state while the semiconductor element 5 of an upper arm on the right side is in the switch-off state in a state where the semiconductor element 5 of an upper arm on the left side and the semiconductor element 6 of a lower arm in the middle are off and the semiconductor element 6 of a lower arm on the left side and the semiconductor element 5 of the upper arm in the middle are on. The arrow of the external terminal 28 and the arrow of the circuit pattern layer $9b_1$ illustrated in FIG. 3A correspond to an arrow A1 and an arrow A2 illustrated in FIG. 2B, and the arrow of the flat plate portion 27s of the external terminal 27 and the arrow of the extending portion 27t illustrated in FIG. 3A correspond to arrows B1 and B2 illustrated in FIG. 2B. In FIG. 3A, the current of the arrow A1 and the current of the arrow B2 flow in the same direction (up direction) in parallel. The current of the arrow A2 and the current of the arrow B1 flow in the same direction (right direction) in parallel.

When the current flowing through the pin-shaped terminal 16, the circuit pattern layer $4c_1$, the semiconductor element 6, the connecting pin 8, the circuit pattern layer $9b_2$, the pin-shaped terminal 17, and the external terminal 27 (the flat plate portion 27s, the extending portion 27t) in the stated order is reduced, and the rate of change of current of the current (also referred to as a rate of change of time dI/dt) is negative, since a current attempting to maintain the flow of the current is generated by energy accumulated in a W phase coil of the motor 30, the feedback current flowing through the pin-shaped terminal 16, the circuit pattern layer $4c_1$, the connecting pin 11, the circuit pattern layer $9b_1$, the connecting pin 7, the diode 12, the circuit pattern layer $3c$, the pin-shaped terminal 18, and the external terminal 28 (the flat plate portion 28s, the extending portion 28t) in the stated order is increased, and the rate of change of current (also referred to as the rate of change of time) of the feedback current becomes positive. Therefore, a sign of the rate of change of current of the current flowing through the flat plate portion 27s is a sign inverse to a sign of the rate of change of current of the current flowing through the second circuit pattern layer 9b, and a sign of the rate of change of current of the current flowing through the extending portion 28t of the external terminal 28 is a sign inverse to a sign of the rate of change of current of the current flowing through the extending portion 27t of the external terminal 27.

FIG. 2C illustrates the intermediate state at the time of the phase switching, and illustrates current flows using arrows when the semiconductor element 5 of the upper arm on the right side is switched from the switch-on state to the switch-off state while the semiconductor element 6 of the lower arm on the right side is in the switch-off state in a state where the semiconductor element 5 of the upper arm on the left side and the semiconductor element 6 of the lower arm in the middle are off and the semiconductor element 6 of the lower arm on the left side and the semiconductor element 5 of the upper arm in the middle are on. The arrow of the external terminal 28 and the arrow of the circuit pattern layer $9b_1$ illustrated in FIG. 3B correspond to the arrow A1 and the arrow A2 illustrated in FIG. 2C, and the arrow of the flat plate portion 27s of the external terminal 27 and the arrow of the extending portion 27t illustrated in FIG. 3B correspond to the arrows B1 and B2 illustrated in FIG. 2C. In FIG. 3B, the current of the arrow A1 and the current of the arrow B2 flow in the same direction (down direction) in parallel. The current of the arrow A2 and the current of the arrow B1 flow in the same direction (left direction) in parallel.

When the current flowing through the external terminal 28 (the extending portion 28t, the flat plate portion 28s), the pin-shaped terminal 18, the circuit pattern layer $3c$, the semiconductor element 5, the connecting pin 7, the circuit pattern layer $9b_1$, the connecting pin 11, the circuit pattern layer $4c_1$, and the pin-shaped terminal 16 in the stated order is reduced, that is, when the rate of change of current of the current is negative, since the current attempting to maintain the flow of the current is generated by the energy accumulated in the W phase coil of the motor 30, the feedback current flowing through the external terminal 27 (the extending portion 27t, the flat plate portion 27s), the pin-shaped terminal 17, the circuit pattern layer $9b_2$, the connecting pin 8, the diode 13, the circuit pattern layer $4c_1$, and the pin-shaped terminal 16 is increased, that is, the rate of change of current of the feedback current becomes positive. Therefore, the sign of the rate of change of current of the current flowing through the flat plate portion 27s is a sign inverse to the sign of the rate of change of current of the current flowing through the second circuit pattern layer 9b, and the sign of the rate of change of current of the current flowing through the extending portion 28t of the external terminal 28 is a sign inverse to the sign of the rate of change of current of the current flowing through the extending portion 27t of the external terminal 27.

In a case where on/off of the semiconductor elements 5 and 6 of the upper and lower arms is switched by the pulse width modulation (PWM) method too, a current flowing direction of the current flowing through the extending portion 27t of the external terminal 27 is in parallel with the current flowing through the extending portion 28t of the external terminal 28, and signs of the rate of change of currents of the currents (also referred to as rate of change of times aids) become mutually inverse signs. Similarly, the current flowing through the flat plate portion 27s of the external terminal 27 is in parallel with the current flowing through the circuit pattern layer $9b_1$ of the printed circuit board 9, and signs of the rate of change of currents of the currents become mutually inverse signs.

A fabrication method for the semiconductor device 1 will be described.

First, the main body 10, the cap 20, and the external terminals 26, 27, and 28 are respectively prepared. Herein, the main body 10 is assembled as follows.

First, the connecting pins 7, 8, 11, 14, and 15 and the pin-shaped terminals 16, 17, 18, and 19 are inserted into a plurality of through holes (not illustrated) of the printed circuit board 9. It is noted that the connecting pins 7, 8, 11, 14, and 15 and the pin-shaped terminals 16, 17, 18, and 19 are composed of a metal containing copper as a main constituent, and a tin (Sn) plating layer is formed on an outer circumference surface. Subsequently, the circuit substrates 3 and 4 are arranged side by side on a first fixture that is not illustrated, and a bonding material such as soldering (not illustrated) is applied to a region on the circuit pattern layers $3c$, $4c_1$, $4c_2$, and $4c_3$ of the circuit substrates 3 and 4 to which the semiconductor elements 5 and 6, the diodes 12 and 13, the connecting pins 7, 8, 11, 14, and 15, and the pin-shaped terminals 16, 17, and 18 are connected. Then, after the semiconductor elements 5 and 6 and the diodes 12 and 13 are mounted on the circuit pattern layer 3c of the circuit substrate 3 and the circuit pattern layer 4c (the circuit pattern 4c$_1$) of the circuit substrate 4, soldering is applied to the front surface electrodes (the emitter electrodes and the gate electrodes) of the semiconductor elements 5 and 6. Subsequently, when necessary, a second fixture that guides installment of the printed circuit board 9 is put on the first fixture. Subsequently, the printed circuit board 9 into which the above-mentioned connecting pin or the like is inserted is placed on the circuit substrates 3 and 4 to which the semiconductor elements 5 and 6 are mounted.

Next, when reflow is performed on the above-described assembly body using a reflow furnace, the bonding material and the tin plating layer are fused, the semiconductor elements 5 and 6 and the diodes 12 and 13 are respectively bonded on the circuit pattern layers 3c and 4c of the circuit substrates 3 and 4, lower ends of the pin-shaped terminals 16, 17, and 18 are respectively bonded to the circuit patterns 4c$_1$, 4c$_2$, and 4c$_3$ of the circuit substrate 4 and the circuit pattern layer 3c of the circuit substrate 3, lower ends of the connecting pins 7 and 8 are respectively bonded onto the front surface electrodes of the semiconductor elements 5 and 6, a lower end of the connecting pin 11 is bonded to an upper surface of the circuit pattern 4c$_1$ of the circuit substrate 4, a lower end of the connecting pin 14 is bonded to an upper surface of the diode 12, a lower end of the connecting pin 15 is bonded to onto the diode 13, and lower ends of the external terminals 19 (19a, 19b, 19c, 19d) are bonded to the circuit pattern layer 9b of the printed circuit board 9.

Finally, the circuit substrates 3 and 4 to which the semiconductor elements 5 and 6 are respectively mounted are sealed. After the fixture is removed from an internal structure after the above-mentioned reflow, the internal structure is arranged in a die or mold, a molding material such as thermosetting resin is injected therein, and a side on the main surfaces of the circuit substrates 3 and 4 is sealed using molding. Accordingly, the circuit substrates 3 and 4, the semiconductor elements 5 and 6, the diodes 12 and 13, the connecting pins 7, 8, 11, 14, and 15, the printed circuit board 9, and the pin-shaped terminals 16, 17, 18, and 19 are solidly sealed in the casing 2. Then, the casing 2 is formed by being removed from the die, and the main body 10 is constituted.

Figure 4B:
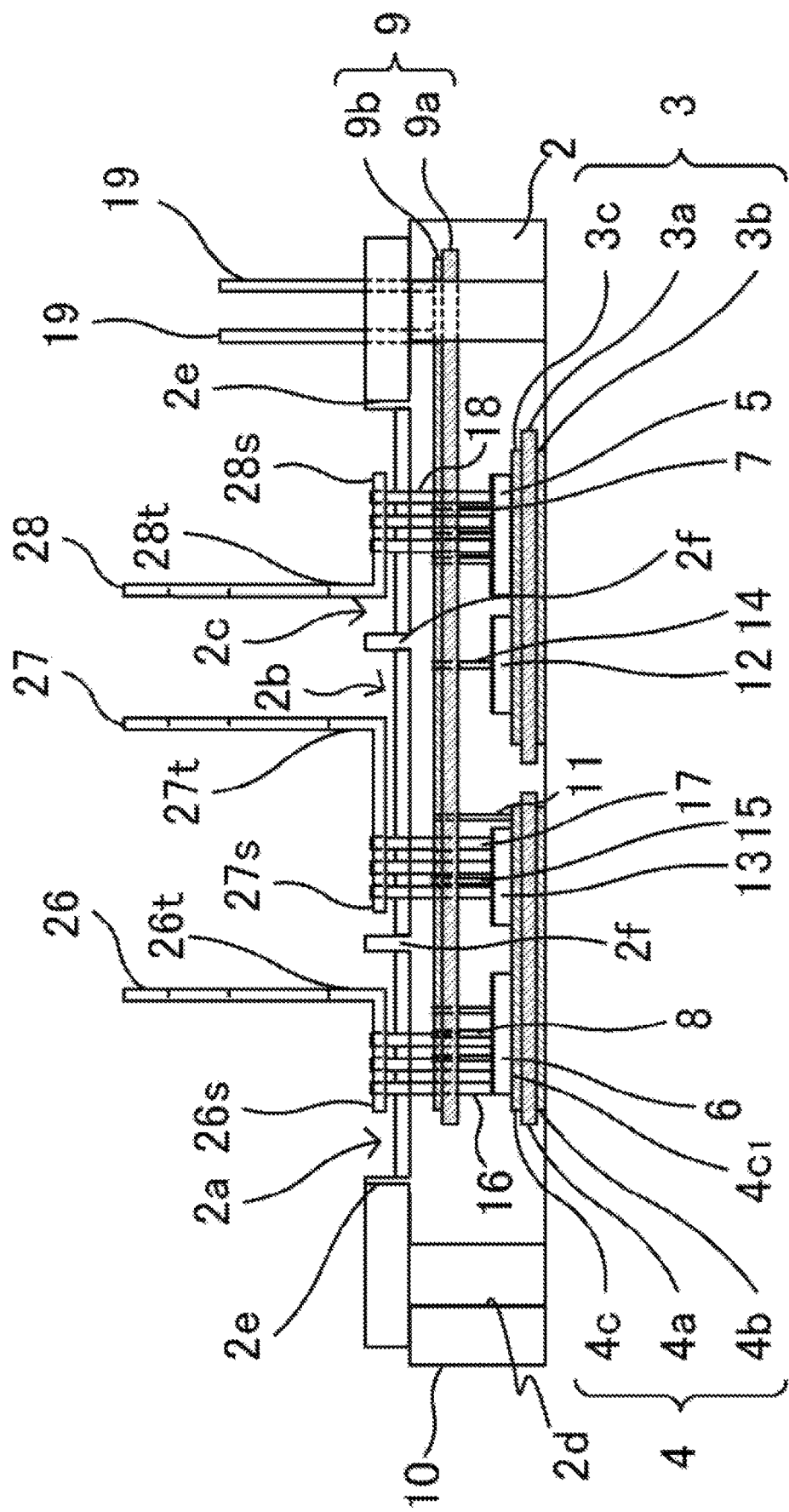
FIG. 4B is a diagram illustrating a state where the external terminal is connected to the pin-shaped terminal of the main body with regard to the reference line BB in FIG. 4A.

Next, as illustrated in FIG. 4A and FIG. 4B, the external terminals 26, 27, and 28 are respectively connected to the pin-shaped terminals 16, 17, and 18 of the main body 10. Specifically, first, the L-shaped external terminals 26, 27, and 28 are prepared in which the flat plate portions 26s, 27s, and 28s of the external terminals 26, 27, and 28 are horizontally held, that is, in parallel with the upper surface of the main body 10, and the extending portions 26t, 27t, and 28t are directed and held in the height direction. A plurality of through holes (not illustrated) are respectively formed in the vicinity of both opposite lateral sides of the flat plate portions 26s, 27s, and 28s. Then, upper ends of the pin-shaped terminals 16a, 17a, and 18a and 16b, 17b, and 18b that are provided side by side in the vicinity of both the opposite lateral sides along the longitudinal direction of the main body 10 and protrude upward are inserted into the plurality of respective through holes of the flat plate portions 26s, 27s, and 28s. The upper ends of the pin-shaped terminals 16a, 17a, and 18a and 16b, 17b, and 18b are irradiated with laser, and the respective pin-shaped terminals are connected to the external terminals 26, 27, and 28. Accordingly, the plurality of pin-shaped terminals 16a, 17a, and 18a and 16b, 17b, and 18b are respectively connected to areas in the vicinity of opposite lateral sides of the flat plate portions 26s, 27s, and 28s in the transverse direction of the sealing member 2.

Next, as illustrated in FIG. 5A and FIG. 5B, the cap 20 is attached onto the main body 10. First, the extending portions 26t, 27t, and 28t of the external terminals 26, 27, and 28 are respectively inserted upward through the through holes 21b, 22b, and 23b of the cap 20 from the lower side of the cap 20. Then, the cap 20 is put on the main body 10. Accordingly, the cap 20 has the lower end of the side surface engaged with the insulating wall 2g on the upper surface of the casing 2, and the lower end of the insulating wall (cap-side insulating wall) 20c is fitted into the insulating wall (sealing member-side insulating wall) 2e on the upper surface of the casing 2 to be supported on an upper surface peripheral edge of the casing 2, so that a space isolated from the outer side of the cap 20 is formed between the cap 20 and the main body 10 (casing 2). Furthermore, when the lower end of the insulating wall (cap-side insulating wall) 20d is engaged with the insulating wall (sealing member-side insulating wall) 2f on the upper surface of the casing 2, the space between the cap 20 and the main body 10 (casing 2) is segmented into the three spaces 2a, 2b, and 2c on the casing 2 corresponding to the nut accommodation portions 21, 22, and 23, and the pin-shaped terminals 16, 17, and 18 located within the respective spaces and the external terminals 26, 27, and 28 connected to these are mutually isolated.

It is noted that the external terminals 26, 27, and 28 are allowed to be respectively inserted through the through holes 21b, 22b, and 23b of the cap 20, and at the same time, the pin-shaped terminal 19 is inserted through a through hole (not illustrated) of the convex portion 29s of the cap 20. Thus, the leading edge of the pin-shaped terminal 19 is fed from the convex portion 29s onto the cap 20 to be supported by the convex portion 29s.

Next, the nuts 26b, 27b, and 28b are inserted into the nut holes 21a, 22a, and 23a in a state where the female screws of these nuts are directed in the height direction. It is noted that the external terminals 26, 27, and 28 include through holes in the ends of the extending portions 26t, 27t, and 28t on a side opposite to the flat plate portions 26s, 27s, and 28s.

Finally, the extending portions 26t, 27t, and 28t are bent above the nut accommodation portions 21, 22, and 23 such that the through holes are arranged above the nuts 26b, 27b, and 28b. In this manner, the external terminals 26, 27, and 28 are respectively fixed onto the nut accommodation portions 21, 22, and 23 of the cap 20 to constitute the semiconductor device 1 (see FIG. 1A to FIG. 1C).

In accordance with the semiconductor device 1 according to the present embodiment, when the configuration is adopted in which the cap 20 is supported onto the main body 10, the respective components are optimally arranged to compactly constitute the main body 10 at the minimum thickness, and the lengths of the flat plate portions 26s, 27s, and 28s and the like are appropriately selected. Thus, it is possible to assemble the semiconductor device 1 having the standard size and shape in such a manner that the external terminals 26, 27, and 28 are arbitrarily arranged on the cap 20 and connected to the pin-shaped terminals 16, 17, and 18 protruding from the upper surface of the main body 10.

It is noted that in the semiconductor device 1 according to the present embodiment, when a plurality of components are included such as the nut accommodation portions 21, 22, and 23 of the cap 20, the connecting pins 7 and 8, the pin-shaped terminals 16, 17, 18, and 19, and the external terminals 26, 27, and 28, the respective components are equivalently or similarly constituted, but at least a part of the components may be constituted to be different from the other component.

While the embodiments of the present invention have been described, the technical scope of the invention is not limited to the above-described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCE SYMBOLS

1: semiconductor device; 2: casing (example of a sealing member); 2a: space; 2b: space; 2c: space; 2d: through hole; 2e: insulating wall (sealing member-side insulating wall); 2f: insulating wall (sealing member-side insulating wall); 3: circuit substrate (example of a first circuit substrate); 3a: insulating plate; 3b: metallic layer; 3c: circuit pattern layer (example of a first circuit pattern layer); 4: circuit substrate (example of the first circuit pattern layer); 4a: insulating plate; 4b: metallic layer; 4c: circuit pattern layer (example of a first circuit pattern layer); $4c_1$: circuit pattern layer (example of the first circuit pattern layer); $4c_2$: circuit pattern layer connected to a pin-shaped terminal 17a; $4c_3$: circuit pattern layer connected to a pin-shaped terminal 17b; 5: semiconductor element; 6: semiconductor element; 7: connecting pin; 8: connecting pin; 9: printed circuit board (example of a second circuit substrate); 9a: insulating plate; 9b: circuit pattern layer (example of the second circuit substrate); $9b_1$: circuit pattern layer that provides connection between the connecting pin 7 and a connecting pin 11 (example of the second circuit substrate); $9b_2$: circuit pattern layer that provides connection between the connecting pin 8 and a pin-shaped terminal 17 (example of the second circuit substrate); $9b_3$: circuit pattern layer serving as a gate wiring; $9b_4$: circuit pattern layer serving as the gate wiring; 10: main body; 11: connecting pin; 12: diode; 13: diode; 14: connecting pin; 15: connecting pin; 16: pin-shaped terminal; 16a: pin-shaped terminal; 16b: pin-shaped terminal; 17: pin-shaped terminal; 17a: pin-shaped terminal; 17b: pin-shaped terminal; 18: pin-shaped terminal; 18a: pin-shaped terminal; 18b: pin-shaped terminal; 19: pin-shaped terminal; 19a: pin-shaped terminal; 19b: pin-shaped terminal; 19c: pin-shaped terminal; 19d: pin-shaped terminal; 20: cap; 20a: notch; 20c: insulating wall (cap-side insulating wall); 20d: insulating wall (cap-side insulating wall); 21: nut accommodation portion; 21a: nut hole; 21b: through hole; 22: nut accommodation portion; 22a: nut hole; 22b: through hole; 23: nut accommodation portion; 23a: nut hole; 23b: through hole; 26: external terminal; 26a: through hole; 26b: nut; 26s: flat plate portion; 26t: extending portion; 27: external terminal; 27a: through hole; 27b: nut; 27s: flat plate portion; 27t: extending portion; 28: external terminal (example of another external terminal); 28a: through hole; 28b: nut; 28s: flat plate portion (example of another flat plate portion); 28t: extending portion (example another extending portion); 29s: convex portion; 30: motor

What is claimed is:

1. A semiconductor device comprising:
   a first circuit substrate including a first circuit pattern layer;
   a semiconductor element mounted to the first circuit pattern layer;
   a second circuit substrate including a second circuit pattern layer;
   a connecting pin that connects the semiconductor element to the second circuit pattern layer;
   a pin-shaped terminal electrically connected to the second circuit pattern layer;
   a sealing member that seals the first circuit substrate, the semiconductor element, the second circuit substrate, and the connecting pin using resin; and
   an external terminal including a flat plate portion and an extending portion that is bent from the flat plate portion and extends in a direction away from the second circuit substrate, wherein:
   the flat plate portion is to in physical contact with the pin-shaped terminal and arranged in parallel with the second circuit pattern layer; and
   the extending portion is provided in a range of a width in a transverse direction of the sealing member.

2. The semiconductor device according to claim 1, wherein a sign of a rate of change of current of a current flowing through the flat plate portion is a sign inverse to a sign of a rate of change of current of a current flowing through the second circuit pattern layer.

3. The semiconductor device according to claim 1, wherein currents are caused to flow in the flat plate portion and the second circuit pattern layer in a same direction in parallel.

4. The semiconductor device according to claim 1, comprising:
   another external terminal including another extending portion electrically connected to the first circuit pattern layer and arranged in parallel with the extending portion.

5. The semiconductor device according to claim 1, wherein a plurality of the pin-shaped terminals are respectively connected to areas in the vicinity of opposite lateral sides of the flat plate portion in the transverse direction of the sealing member.

6. The semiconductor device according to claim 1, comprising:
   a cap including a plurality of through holes that allow insertion of the extending portions.

7. The semiconductor device according to claim 6, wherein:
   the cap includes a nut accommodation portion that accommodates a nut; and
   the external terminal includes a through hole at an end of the extending portion opposite to the flat plate portion, and the extending portion is bent in such a manner that the through hole is arranged above the nut.

8. The semiconductor device according to claim 1, comprising:
   a plurality of external terminals including flat plate portions and extending portions that are bent from the flat plate portions and extend in the direction away from the second circuit substrate;
   a cap including a plurality of through holes that allow insertion of the extending portions; and insulating walls that extend from the cap or the sealing member and provided on outer circumferences of the flat plate portions, wherein the flat plate portions are arranged in spaces surrounded by the cap, the sealing member, and the insulating walls.

9. The semiconductor device according to claim 8, wherein:

the insulating walls include a sealing member-side insulating wall that extends from the sealing member, and a cap-side insulating wall that extends from the cap; and a side surface of the sealing member-side insulating wall is in direct contact with a side surface of the cap-side insulating wall.

10. The semiconductor device according to claim 4, wherein a length of the flat plate portion of the external terminal is longer than a length of another flat plate portion of the other external terminal in a longitudinal direction of the sealing member.

11. The semiconductor device according to claim 4, comprising:

another first circuit substrate arranged to be adjacent to the first circuit substrate, and connected to the other external terminal, wherein the flat plate portion of the external terminal extends up to an area above the other first circuit substrate.

12. The semiconductor device according to claim 10, comprising:

another first circuit substrate arranged to be adjacent to the first circuit substrate, and connected to the other external terminal, wherein the flat plate portion of the external terminal extends up to an area above the other first circuit substrate.

* * * * *